United States Patent
Roberts et al.

(10) Patent No.: US 11,361,240 B2
(45) Date of Patent: Jun. 14, 2022

(54) FLUX BIAS LINES BELOW QUBIT PLANE

(71) Applicant: Intel Corporation, Santa Clara, CA (US)

(72) Inventors: Jeanette M. Roberts, North Plains, OR (US); Ravi Pillarisetty, Portland, OR (US); Zachary R. Yoscovits, Beaverton, OR (US); James S. Clarke, Portland, OR (US); David J. Michalak, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 859 days.

(21) Appl. No.: 16/307,970

(22) PCT Filed: Jul. 1, 2016

(86) PCT No.: PCT/US2016/040601
§ 371 (c)(1),
(2) Date: Dec. 7, 2018

(87) PCT Pub. No.: WO2018/004634
PCT Pub. Date: Jan. 4, 2018

(65) Prior Publication Data
US 2019/0164077 A1 May 30, 2019

(51) Int. Cl.
*H01L 39/22* (2006.01)
*G06N 10/00* (2022.01)
(Continued)

(52) U.S. Cl.
CPC .......... *G06N 10/00* (2019.01); *G01R 33/035* (2013.01); *G01R 33/0354* (2013.01); *H01L 39/223* (2013.01); *H01L 39/2493* (2013.01)

(58) Field of Classification Search
CPC combination set(s) only.
See application file for complete search history.

(56) References Cited

U.S. PATENT DOCUMENTS

| 4,176,290 A | 11/1979 | Ishida et al. |
| 8,610,453 B2 | 12/2013 | Herr |

(Continued)

FOREIGN PATENT DOCUMENTS

| JP | 2010511293 | 4/2010 |
| WO | 2008064491 A1 | 6/2008 |

(Continued)

OTHER PUBLICATIONS

PCT/US2016/040602, Jul. 1, 2016, Interconnects Below Qubit Plane.

(Continued)

*Primary Examiner* — Shahed Ahmed
(74) *Attorney, Agent, or Firm* — Patent Capital Group

(57) ABSTRACT

Described herein are structures that include flux bias lines for controlling frequencies of qubits in quantum circuits. An exemplary structure includes a substrate, a qubit provided over a surface of the substrate, and a flux bias line provided below the surface of the substrate and configured to control the frequency of the qubit via a magnetic field generated as a result of a current flowing through the flux bias line. Methods for fabricating such structures are disclosed as well.

25 Claims, 15 Drawing Sheets

(51) Int. Cl.
*G01R 33/035* (2006.01)
*H01L 39/24* (2006.01)

(56) References Cited

U.S. PATENT DOCUMENTS

| | | | |
|---|---|---|---|
| 8,654,578 | B2 | 2/2014 | Lewis et al. |
| 9,589,236 | B1* | 3/2017 | Abdo .............. H01L 29/778 |
| 2003/0111661 | A1 | 6/2003 | Tzalenchuk et al. |
| 2004/0173787 | A1 | 9/2004 | Blais et al. |
| 2007/0174227 | A1* | 7/2007 | Johnson .............. G06N 10/00 706/62 |
| 2009/0173936 | A1 | 7/2009 | Bunyk |
| 2011/0057169 | A1 | 3/2011 | Harris et al. |
| 2012/0074386 | A1 | 3/2012 | Rachmady et al. |
| 2012/0187378 | A1 | 7/2012 | Bonderson et al. |
| 2012/0319085 | A1 | 12/2012 | Gambetta et al. |
| 2014/0235450 | A1 | 8/2014 | Chow et al. |
| 2014/0264285 | A1 | 9/2014 | Chow et al. |
| 2014/0264286 | A1 | 9/2014 | Chang et al. |
| 2016/0079968 | A1 | 3/2016 | Strand et al. |
| 2016/0148112 | A1 | 5/2016 | Kwon |
| 2016/0335558 | A1* | 11/2016 | Bunyk .............. G06N 10/00 |
| 2018/0004635 | A1 | 1/2018 | Murthy |
| 2019/0131511 | A1 | 5/2019 | Clarke et al. |
| 2019/0140073 | A1 | 5/2019 | Pillarisetty et al. |
| 2019/0148530 | A1 | 5/2019 | Pillarisetty et al. |
| 2019/0157393 | A1 | 5/2019 | Roberts et al. |
| 2019/0165152 | A1 | 5/2019 | Roberts et al. |
| 2019/0259850 | A1 | 8/2019 | Pillarisetty et al. |
| 2019/0288176 | A1 | 9/2019 | Yoscovits et al. |
| 2019/0296214 | A1 | 9/2019 | Yoscovits et al. |
| 2019/0305037 | A1 | 10/2019 | Michalak et al. |
| 2019/0312128 | A1 | 10/2019 | Roberts et al. |
| 2019/0341459 | A1 | 11/2019 | Pillarisetty et al. |
| 2019/0363181 | A1 | 11/2019 | Pillarisetty et al. |
| 2019/0363239 | A1 | 11/2019 | Yoscovits et al. |
| 2020/0280316 | A1* | 9/2020 | Reagor .............. H03K 19/195 |

FOREIGN PATENT DOCUMENTS

| | | |
|---|---|---|
| WO | 2015013532 A1 | 1/2015 |
| WO | 2016069032 A1 | 5/2016 |
| WO | 2017155531 A1 | 9/2017 |
| WO | 2017213638 A1 | 12/2017 |
| WO | 2017213639 A1 | 12/2017 |
| WO | 2017213641 A1 | 12/2017 |
| WO | 2017213645 A1 | 12/2017 |
| WO | 2017213646 A1 | 12/2017 |
| WO | 2017213647 A1 | 12/2017 |
| WO | 2017213648 A1 | 12/2017 |
| WO | 2017213649 A1 | 12/2017 |
| WO | 2017213651 A1 | 12/2017 |
| WO | 2017213661 A1 | 12/2017 |
| WO | 2017217958 A1 | 12/2017 |
| WO | 2018004634 A1 | 1/2018 |
| WO | 2018004635 A1 | 1/2018 |
| WO | 2018004636 A1 | 1/2018 |
| WO | 2018063168 A1 | 4/2018 |

OTHER PUBLICATIONS

PCT/US2016/04060, Jul. 1, 2016, Flux Bias Lines Below Qubit Plane.
PCT/US2016/040603, Jul. 1, 2016, Alternative Route to Forming Interconnects Below the Qubit Plane: Bonding of Crystalline Materials on Top of Conventional Interconnects.
PCT/US2016/054039, Sep. 28, 2016, On-Chip Resonance Frequency Tuning for Integrated Superconducting Resonator Structures for Quantum Information Processing Applications.
PCT/US2017/046402, Aug. 11, 2017, Undercut Aluminum Below Superconducting Resonators.
PCT/US2017/046404, Aug. 11, 2017, Josephon Junction Connected Below Resonator.
"A surface code quantum computer in silicon," Charles D. Hill, et al., Science Advances vol. 1, No. 9, e1500707, Oct. 30, 2015.
"An opto-magneto-mechanical quantum interface between distant superconducting qubits," Xia, et al., Scientific Reports 4, Article No. 5571, Jul. 4, 2014.
"Concentric transmon qubit featuring fast turnability and an anisotropic magnetic dipole moment," Braumuller, et al., Applied Physics Letters, vol. 108, Issue 3, Jan. 2016.
"Cryogenic Control Architecture for Large-Scale Quantum Computing," Hornibrook, et al., arXiv:1409.2202v1 [cond-mat.mes-hall] Sep. 8, 2014; 8 pages.
"Embracing the quantum limit in silicon computing," Morton et al, Macmillan Publishers, Nov. 17, 2011, vol. 479, Nature, pp. 345-353.
"Fabrication and Characterization of Aluminum Airbridges for Superconducting Microwave Circuits," Chen, et al., arXiv:1310.2325v1 [condo-mat.mes-hall] Oct. 9, 2013, 8 pages.
"Independent, extensible control of same-frequency superconducting qubits by selective broadcasting," Asaad et al., Netherlands Organisation for Applied Scientific Research, Aug. 28, 2015, 17 pages.
"Magnetic field tuning of coplanar waveguide resonators," Healey, J.E., et al., Applied Physics Letters 93, 043513 (2008), pp. 043513-1 through 3, published Jul. 31, 2008 (4 pages with cover sheet).
"Multilayer microwave integrated quantum circuits for scalable quantum computing," Brecht et al, Department of Applied Physics, Yale University, Sep. 4, 2015, 5 pages.
"Reducing intrinsic loss in superconducting resonators by surface treatment and deep etching of silicon substrates," Bruno, et al., QuTech Advanced Research Center and Kavli Institute of Nanoscience, Delft University of Technology, The Netherlands, Feb. 16, 2015, 9 pages.
"Scalable quantum circuit and control for a superconducting surface code," Versluis et al, Netherlands Organisation for Applied Scientific Research, Dec. 28, 2016, 9 pages.
"Surface loss simulations of superconducting coplanar waveguide resonators," Wenner et al, Applied Physics Letters 99, 113513 (2011), Published Sep. 15, 2011, pp. 113513-1 through 3.
"Suspending superconducting qubits by silicon micromachining," Chu et al., Department of Applied Physics, Yale University, Jun. 10, 2016, 10 pages.
International Search Report and Written Opinion in International Patent Application No. PCT/US2016/040601 dated Mar. 31, 2017, 8 pages.
International Search Report and Written Opinion in International Patent Application No. PCT/US2016/040603 dated Apr. 28, 2017; 11 pages.
International Search Report and Written Opinion in International Patent Application No. PCT/US2016/054039 dated May 24, 2017; 12 pages.
International Search Report and Written Opinion in International Patent Application No. PCT/US2017/024396 dated Dec. 15, 2016, 9 pages.
International Search Report and Written Opinion in International Patent Application No. PCT/US2016/040602 dated Mar. 31, 2017, 7 pages.

* cited by examiner

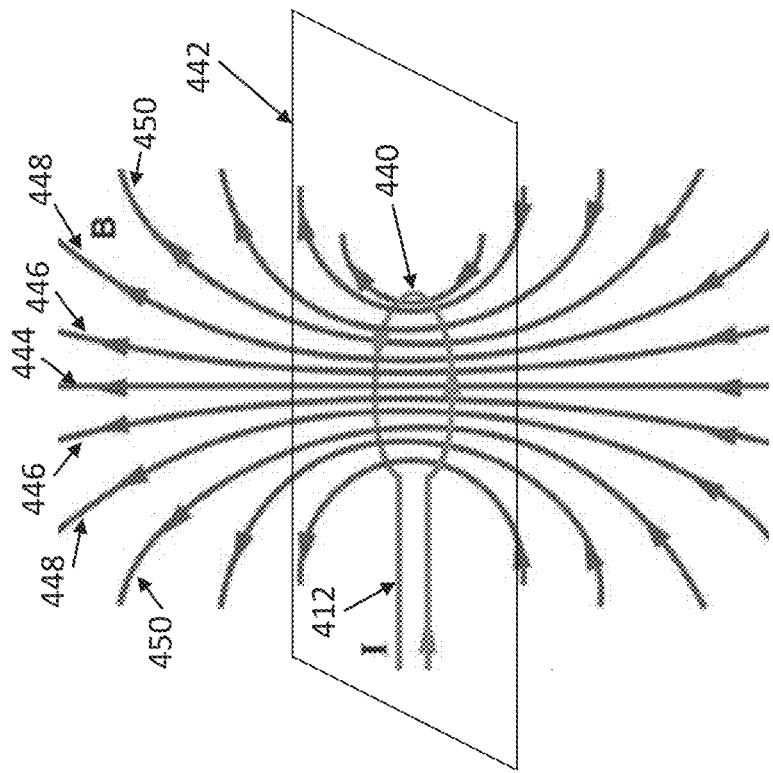
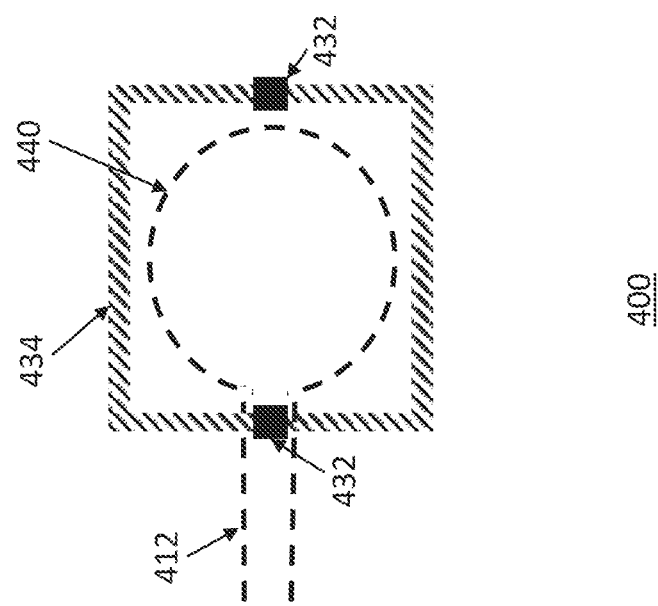
FIG. 4B
FIG. 4A

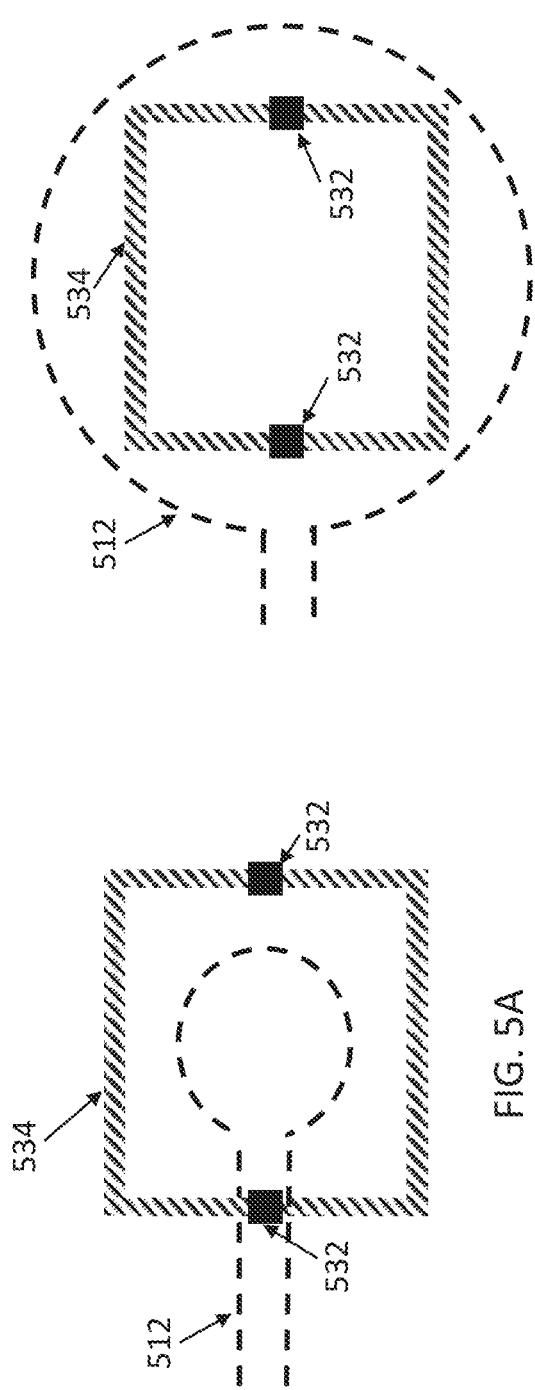
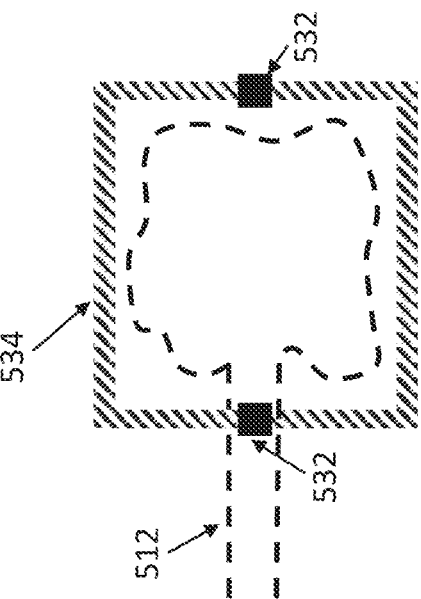
FIG. 5A
FIG. 5B
FIG. 5C

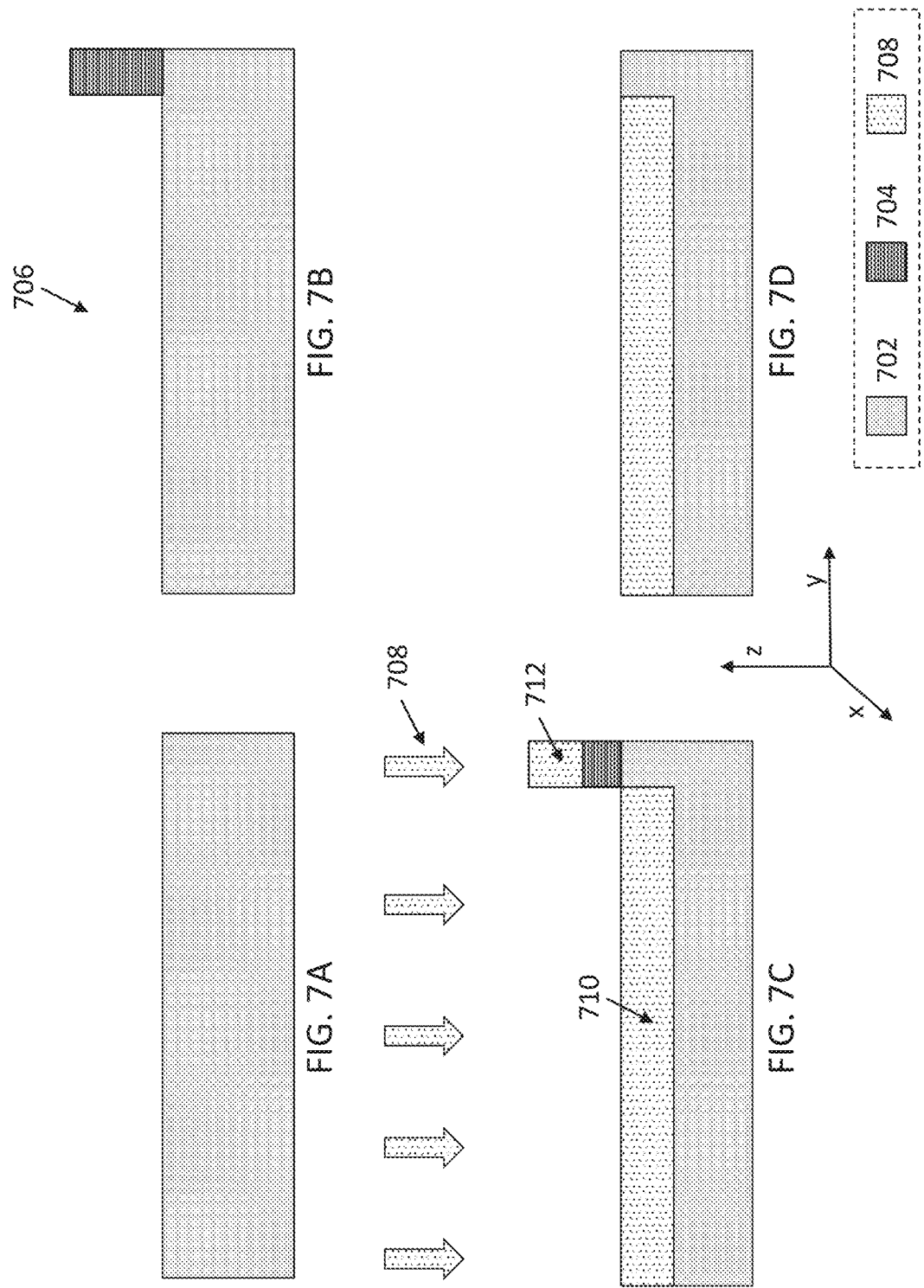

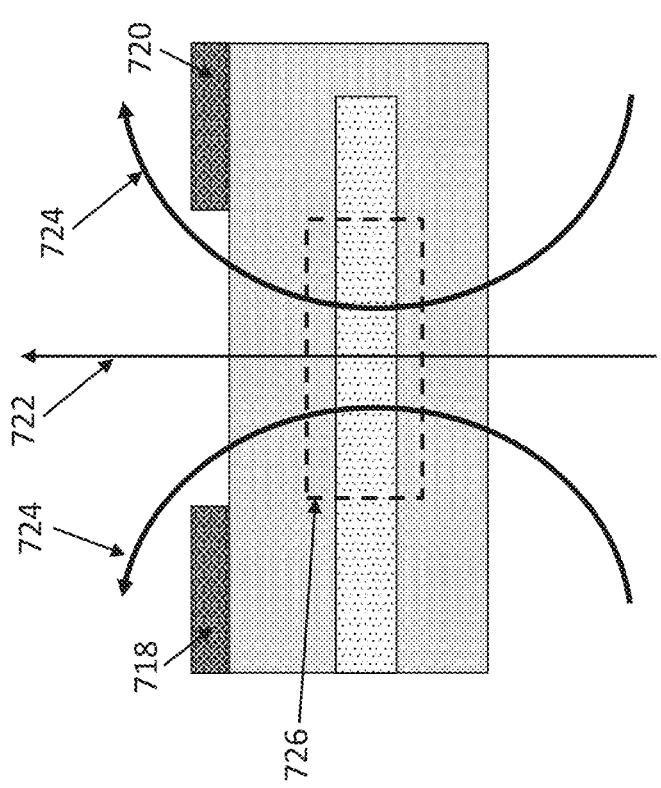
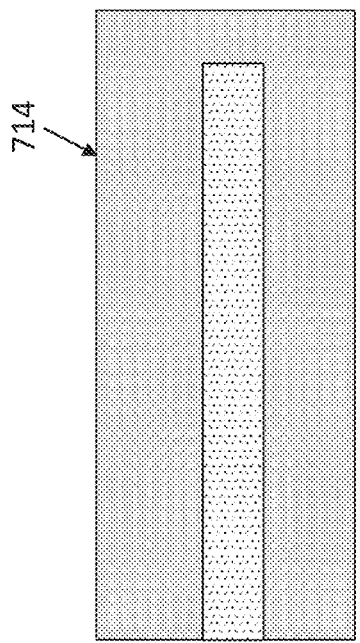
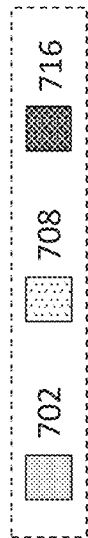
FIG. 7F
FIG. 7E

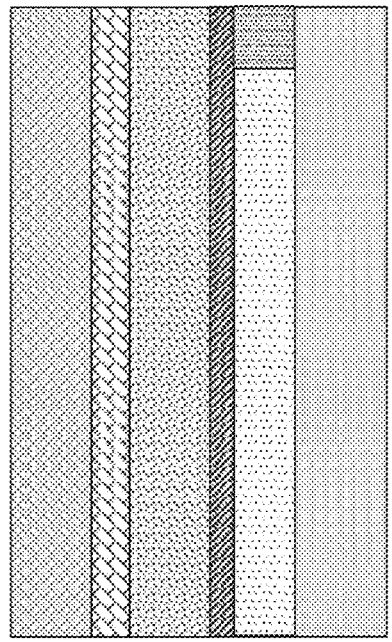
FIG. 9A
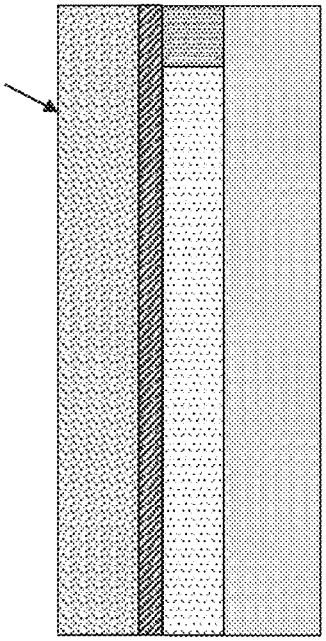
FIG. 9B
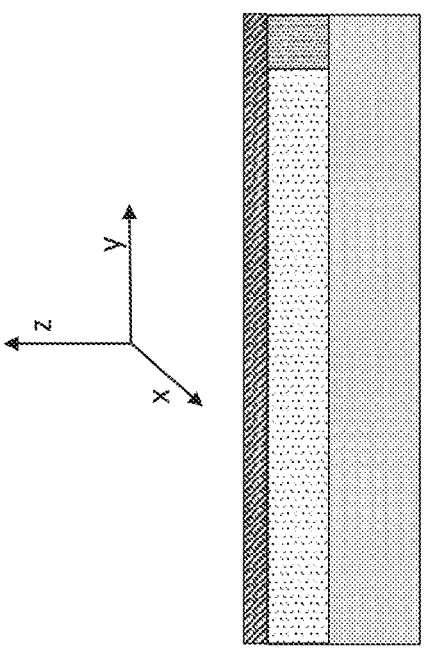
FIG. 9C
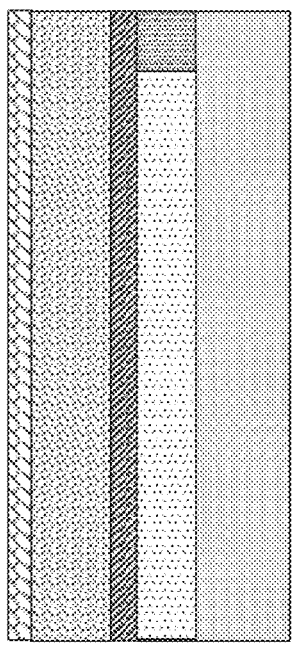
FIG. 9D
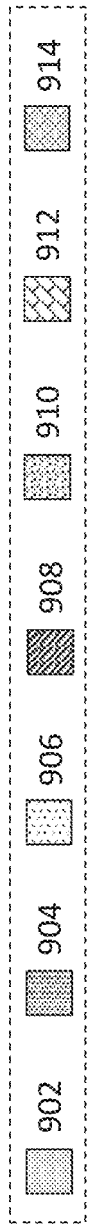

FLUX BIAS LINES BELOW QUBIT PLANE

CROSS-REFERENCE TO RELATED APPLICATION

This Application is a national stage application under 35 U.S.C. § 371 of PCT Application PCT/US2016/040601, filed Jul. 1, 2016, and entitled "FLUX BIAS LINES BELOW QUBIT PLANE," which is hereby incorporated by reference in its entirety.

TECHNICAL FIELD

This disclosure relates generally to the field of quantum computing, and more specifically, to flux bias lines for providing flux control of qubits in quantum circuits.

BACKGROUND

Quantum computing refers to the field of research related to computation systems that use quantum mechanical phenomena to manipulate data. These quantum mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 4A provides a schematic illustration of a structure where flux control of a qubit is implemented by providing a flux bias line below the qubit plane, according to some embodiments of the present disclosure.

FIG. 4B provides a schematic illustration of a magnetic field generated by a looped current-carrying wire, according to some embodiments of the present disclosure.

FIGS. 5A-5F provide schematic illustrations of various geometries of looped flux bias lines provided below the qubit plane, according to various embodiments of the present disclosure.

FIGS. 7A-7F illustrate implementation of various boxes of the method shown in FIG. 6, according to some embodiments of the present disclosure.

FIGS. 9A-9E illustrate implementation of various boxes of the method shown in FIG. 8, according to some embodiments of the present disclosure.

DETAILED DESCRIPTION

Figure 1A:
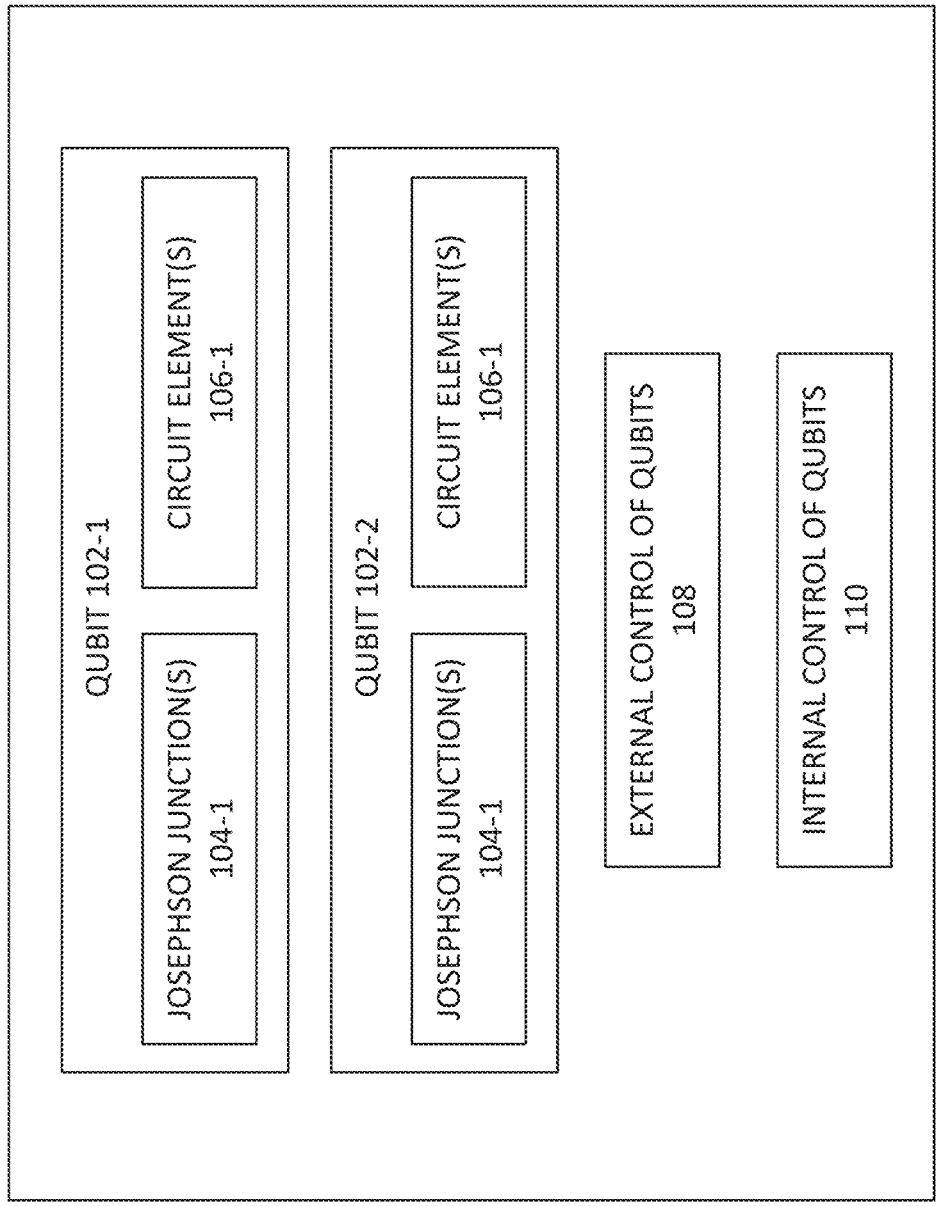
FIG. 1A provides a schematic illustration of a superconducting quantum circuit, according to some embodiments of the present disclosure.

As previously described herein, quantum computing, or quantum information processing, refers to the field of research related to computation systems that use quantum-mechanical phenomena to manipulate data. One example of quantum-mechanical phenomena is the principle of quantum superposition, which asserts that any two or more quantum states can be added together, i.e. superposed, to produce another valid quantum state, and that any quantum state can be represented as a sum of two or more other distinct states. Quantum entanglement is another example of quantum-mechanical phenomena. Entanglement refers to groups of particles being generated or interacting in such a way that the state of one particle becomes intertwined with that of the others. Furthermore, the quantum state of each particle cannot be described independently. Instead, the quantum state is given for the group of entangled particles as a whole. Yet another example of quantum-mechanical phenomena is sometimes described as a "collapse" because it asserts that when we observe (measure) particles, we unavoidably change their properties in that, once observed, the particles cease to be in a state of superposition or entanglement (i.e. by trying to ascertain anything about the particles, we collapse their state).

Put simply, superposition postulates that a given particle can be simultaneously in two states, entanglement postulates that two particles can be related in that they are able to instantly coordinate their states irrespective of the distance between them in space and time, and collapse postulates that when one observes a particle, one unavoidably changes the state of the particle and its' entanglement with other particles. These unique phenomena make manipulation of data in quantum computers significantly different from that of classical computers (i.e. computers that use phenomena of classical physics). Classical computers encode data into binary values, commonly referred to as bits. At any given time, a bit is always in only one of two states—it is either 0 or 1. Quantum computers use so-called quantum bits, referred to as qubits (both terms "bits" and "qubits" often interchangeably refer to the values that they hold as well as to the actual devices that store the values). Similar to a bit of a classical computer, at any given time, a qubit can be either 0 or 1. However, in contrast to a bit of a classical computer, a qubit can also be 0 and 1 at the same time, which is a result of superposition of quantum states. Entanglement also contributes to the unique nature of qubits in that input data to a quantum processor can be spread out among entangled qubits, allowing manipulation of that data to be spread out as well: providing input data to one qubit results in that data being shared to other qubits with which the first qubit is entangled.

Compared to well-established and thoroughly researched classical computers, quantum computing is still in its infancy, with the highest number of qubits in a solid-state quantum processor currently being about 10. One of the main challenges resides in protecting qubits from decoherence so that they can stay in their information-holding states long enough to perform the necessary calculations and read out the results. For this reason, materials, structures, and fabrication methods used for building qubits should continuously focus on reducing spurious (i.e. unintentional and undesirable) two-level systems (TLS's), thought to be the dominant source of qubit decoherence. In general, as used in quantum mechanics, a two-level (also referred to as "two-state") system is a system that can exist in any quantum superposition of two independent and physically distinguishable quantum states. Also for the reason of protection from decoherence, qubits are often operated at cryogenic temperatures, typically just a few degrees or even just a few millidegrees above absolute zero because cryogenic temperatures minimize the detrimental effects of spurious TLS's.

None of the challenges described above ever had to be addressed for classical computers, and these challenges are not easy. In particular, continuously cooling the qubits to keep them at cryogenic temperatures during operation is a difficult task to begin with, further complicated by the fact that cooling efforts are hindered by various sources of temperature increase due to qubits' operation. One such source is flux control of the qubits. As known in the art and described in greater detail below, "flux control" of a qubit generally refers to adjusting the frequency of a qubit by applying a relatively small amount of magnetic field to certain regions of the qubit. The magnetic field is created by e.g. providing direct current (DC) or a pulse of current through a so-called "flux bias line" associated with the qubit. The more qubits are on a chip, the more flux control currents are flowing to control qubits' frequencies, resulting in heating of the chip that needs to be dealt with. Improvements with respect to keeping the qubits at sufficiently low temperatures are always desirable.

As the foregoing description illustrates, building a quantum computer presents unique challenges not encountered in classical computing. The challenges are unique due to, both, the physics of data manipulation being different from that of classical computers (e.g. superposition, entanglement, and collapse), and the physical systems suitable to build quantum circuits of a quantum computer being different (e.g. the systems should be able to operate at cryogenic temperatures and be able to provide substantially lossless connectivity). Described herein are structures that include flux bias lines that, if compared to conventional flux bias lines, are able to control qubits' frequencies by applying less current to generate substantially the same magnetic fields as those that would be generated by conventional flux bias lines. Reducing the current applied for flux control translates to reducing the heating of the chip on which the qubits are provided, which helps in keeping the qubits at sufficiently low temperatures where the effects of spurious TLS's are minimized to improve on the decoherence challenge of the qubits.

In particular, described herein are structures for flux control of qubits in quantum circuit components, and methods for fabricating such structures. An exemplary structure includes a substrate or an interconnect support layer (which two terms may be used interchangeably in the following description) and one or more qubits provided over a surface of the substrate. In addition, the structure includes a flux bias line provided below the substrate surface and configured to control the frequency of the qubit via a magnetic field generated as a result of a current flowing through the flux bias line. Providing a flux bias line below the surface over which the qubit is provided (i.e. below the qubit plane), as opposed to providing a flux bias line in the qubit plane as is done with conventional flux bias lines, allows creation of comparable magnetic flux with less current.

As used herein, the term "line" in context of e.g. flux bias lines does not necessarily imply a straight line. In fact, any geometry of such a line may be used according to various embodiments of the present disclosure, such as e.g. a straight line, or a shape comprising a loop portion, where the term "loop" refers to a shape that is at least partially circular or/and curved over on itself. In the embodiments were a flux bias line comprises a loop portion, the loop portion may trace out an area on a plane that is nearly but not completely enclosed—e.g., the line segment may trace out at least 70% of the perimeter of any enclosed two-dimensional shape such as a square, triangle, circle, or any arbitrary closed shape.

While some descriptions are provided with reference to superconducting qubits, teachings of the present disclosure are applicable to implementations of any qubits, including qubits other than superconducting qubits, which employ tuning the frequency of a qubit by using application of a magnetic flux, all of which implementations are within the scope of the present disclosure.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Furthermore, in the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations need not be performed in the order of presentation. Operations described may be performed in a different order from the described embodiment(s). Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale.

As used herein, terms indicating what may be considered an idealized behavior, such as e.g. "superconducting" or "lossless", are intended to cover functionality that may not be exactly ideal but is within acceptable margins for a given application. For example, a certain level of loss, either in terms of non-zero electrical resistance or non-zero amount of spurious TLS's may be acceptable such that the resulting materials and structures may still be referred to by these "idealized" terms. One metric of interest may be the decay rate associated with these losses (e.g. losses either from TLS's or residual resistance), and as long as the decay rate associated with these mechanisms is not worse than needed in order to achieve a fault-tolerant quantum calculation, then the losses are deemed acceptable and the idealized terms (e.g. superconducting or lossless) —appropriate. Specific values associated with an acceptable decay are expected to change over time as fabrication precision will improve and as fault-tolerant schemes may become more tolerant of higher decay rates. An adapted version of this metric, as well as other metrics suitable for a particular application in determining whether certain behavior may be referred to using idealized terms, are within the scope of the present disclosure.

For purposes of illustrating the techniques for reducing currents in flux bias lines, described herein, it is important to understand the activities that may be present in a typical quantum circuit. The following foundational information may be viewed as a basis from which the present disclosure may be properly explained. Such information is offered for purposes of explanation only and, accordingly, should not be construed in any way to limit the broad scope of the present disclosure and its potential applications.

As previously briefly explained above, quantum computing refers to the use of quantum mechanical properties to perform calculations. Some of these properties include superposition and entanglement. Just as classical computers are composed of bits that can either be in a 1 or a 0 state, a quantum computer is composed of quantum bits (i.e., qubits) which have states of $|0\rangle$ and $|1\rangle$. Quantum mechanics allows for superpositions of the $|0\rangle$ and $|1\rangle$ states with a general form of $a|0\rangle+b|1\rangle$ where a and b are complex numbers. When a qubit state is measured, it collapses to either state $|0\rangle$ with a probability of that happening being $|a|^2$, or to state $|1\rangle$ with a probability of the latter being $|b|^2$. Taking into account the fact that $|a|^2+|b|^2=1$ (since the total probability must sum to unity) and ignoring an overall phase factor which does not have any observable effects, the general state can be re-written as $$\cos\frac{\theta}{2}|0\rangle + e^{i\varphi}\sin\frac{\theta}{2}|1\rangle,$$

where $\varphi$ is the phase difference between the two states.

Entanglement occurs when the interaction between two particles (e.g. two qubits) is such that the states of the two cannot be specified independently, but rather can only be specified for the whole system. This causes the states of the two qubits to be linked together such that measurement of one of the qubits, causes the state of the other qubit to collapse.

In order to realize a quantum computer, a physical system that can act as a qubit is needed. Such a system needs to have at least two states to act as 0 and 1 states. Note that it is not necessary to have a system with exactly only two states if the spacing between each energy level is different, such that each level can be addressed individually.

As illustrated above, ability to manipulate and read out quantum states, making quantum-mechanical phenomena visible and traceable, and ability to deal with and improve on the fragility of quantum states of a qubit present unique challenges not found in classical computers. These challenges explain why so many current efforts of the industry and the academics continue to focus on a search for new and improved physical systems whose functionality could approach that expected of theoretically designed qubits. Physical systems for implementing qubits that have been explored until now include e.g. superconducting qubits, single trapped ion qubits, Silicon (Si) quantum dot qubits, photon polarization qubits, etc.

Out of the various physical implementations of qubits listed above, superconducting qubits are promising candidates for building a quantum computer.

Three classes are typically differentiated within a family of superconducting qubits: charge qubits, flux qubits (also known as "persistent current qubits") and phase qubits, depending on whether a variable that defines the quantum states is, respectively, charge, flux, or phase. In addition to these three classes, there also exist hybrid qubits that are mixtures of two or more of these classes.

Superconducting qubits operate based on the Josephson effect, which refers to a macroscopic quantum phenomenon of supercurrent, i.e. a current that, due to zero electrical resistance, flows indefinitely long without any voltage applied, across a device known as a Josephson Junction. Josephson Junctions are integral building blocks in superconducting quantum circuits where they form a basis of quantum circuit elements that can approximate functionality of theoretically designed qubits.

In some implementations, namely when superconducting qubits are implemented as transmon qubits, two basic elements of superconducting quantum circuits are inductors and capacitors. However, circuits made using only these two elements cannot make a system with two energy levels because, due to the even spacing between the system's energy levels, such circuits will produce harmonic oscillators with a ladder of equivalent states. A nonlinear element is needed to have an effective two-level quantum state system, or qubit. Josephson Junction is an example of such non-linear, non-dissipative circuit element.

Josephson Junctions may form the central circuit elements of a superconducting quantum computer. A Josephson Junction may include a thin layer of insulator, typically referred to as a barrier or a tunnel barrier, sandwiched between two layers of superconductor. The Josephson Junction acts as a superconducting tunnel junction. Cooper pairs tunnel across the barrier from one superconducting layer to the other. The electrical characteristics of this tunneling are governed by so-called Josephson relations which provide the basic equations governing the dynamics of the Josephson effect:

$$I = I_c \sin \varphi \quad (1)$$

$$V = \frac{\hbar}{2e} \dot{\varphi} \quad (2)$$

In these equations, $\varphi$ is the phase difference in the superconducting wave function across the junction, $I_c$ (the critical current) is the maximum current that can tunnel through the junction, which depends on the barrier thickness and the area of the junction, V is the voltage across the Josephson Junction, I is the current flowing through the Josephson Junction, h is the reduced Planck's constant, and e is electron's charge. Equations (1) and (2) can be combined to give an equation (3):

$$V = \frac{\hbar}{2eI_c \cos \varphi} \dot{I} \quad (3)$$

Equation (3) looks like the equation for an inductor with inductance L:

$$L = \frac{\hbar}{2eI_C \cos \varphi} \quad (4)$$

Since inductance is a function of $\varphi$, which itself is a function of I, the inductance of a Josephson Junction is non-linear, which makes an LC circuit formed using a Josephson Junction as the inductor have uneven spacing between its energy states.

The foregoing provides an illustration of using a Josephson Junction in a transmon, which is one type of superconducting qubit. In other classes of superconducting qubits, Josephson Junctions combined with other circuit elements have similar functionality of providing the non-linearity necessary for forming an effective two-level quantum state, or qubit. In other words, when implemented in combination with other circuit elements (e.g. capacitors in transmons or superconducting loops in flux qubits), one or more Josephson Junctions allow realizing a quantum circuit element which has uneven spacing between its energy levels resulting in a unique ground and excited state system for the qubit. This is illustrated in FIG. 1A, providing a schematic illustration of a superconducting quantum circuit 100, according to some embodiments of the present disclosure. As shown in FIG. 1A, an exemplary superconducting quantum circuit 100 includes two or more qubits 102 (reference numerals following after a dash, such as e.g. qubit 102-1 and 102-2 indicate different instances of the same or analogous element). Each of the superconducting qubits 102 may include one or more Josephson Junctions 104 connected to one or more other circuit elements 106, which, in combination with the Josephson Junction(s) 104, form a non-linear circuit providing a unique two-level quantum state for the qubit. The circuit elements 106 could be e.g. capacitors in transmons or superconducting loops in flux qubits.

As also shown in FIG. 1A, an exemplary superconducting quantum circuit 100 typically includes means 108 for providing external control of qubits 102 and means 110 for providing internal control of qubits 102. In this context, "external control" refers to controlling the qubits 102 from outside of, e.g, an integrated circuit (IC) chip comprising the qubits, including control by a user of a quantum computer, while "internal control" refers to controlling the qubits 102 within the IC chip. For example, if qubits 102 are transmon qubits, external control may be implemented by means of flux bias lines (also known as "flux lines" and "flux coil lines") and by means of readout and drive lines (also known as "microwave lines" since qubits are typically designed to operate with microwave signals), described in greater detail below. On the other hand, internal control lines for such qubits may be implemented by means of resonators, e.g., coupling and readout resonators, also described in greater detail below.

Any one of the qubits 102, the external control means 108, and the external control means 110 of the quantum circuit 100 may be provided on, over, or at least partially embedded in a substrate or an interconnect support layer (ISL) (not shown in FIG. 1A), which two terms may be used interchangeably. A substrate/ISL may include any substrate/ISL suitable for realizing quantum circuit components, as described above. In one implementation, the substrate/ISL may be a crystalline substrate/ISL such as, but not limited to a silicon or a sapphire substrate/ISL, and may be provided as a wafer or a portion thereof. In other implementations, the substrate/ISL may be non-crystalline. In general, any material that provides sufficient advantages (e.g. sufficiently good electrical isolation and/or ability to apply known fabrication and processing techniques) to outweigh the possible disadvantages (e.g. negative effects of spurious TLS's), and that may serve as a foundation upon which a quantum circuit may be built, falls within the spirit and scope of the present disclosure. Additional examples of substrates include silicon-on-insulator (SOI) substrates, III-V substrates, and quartz substrates.

Figure 1B:
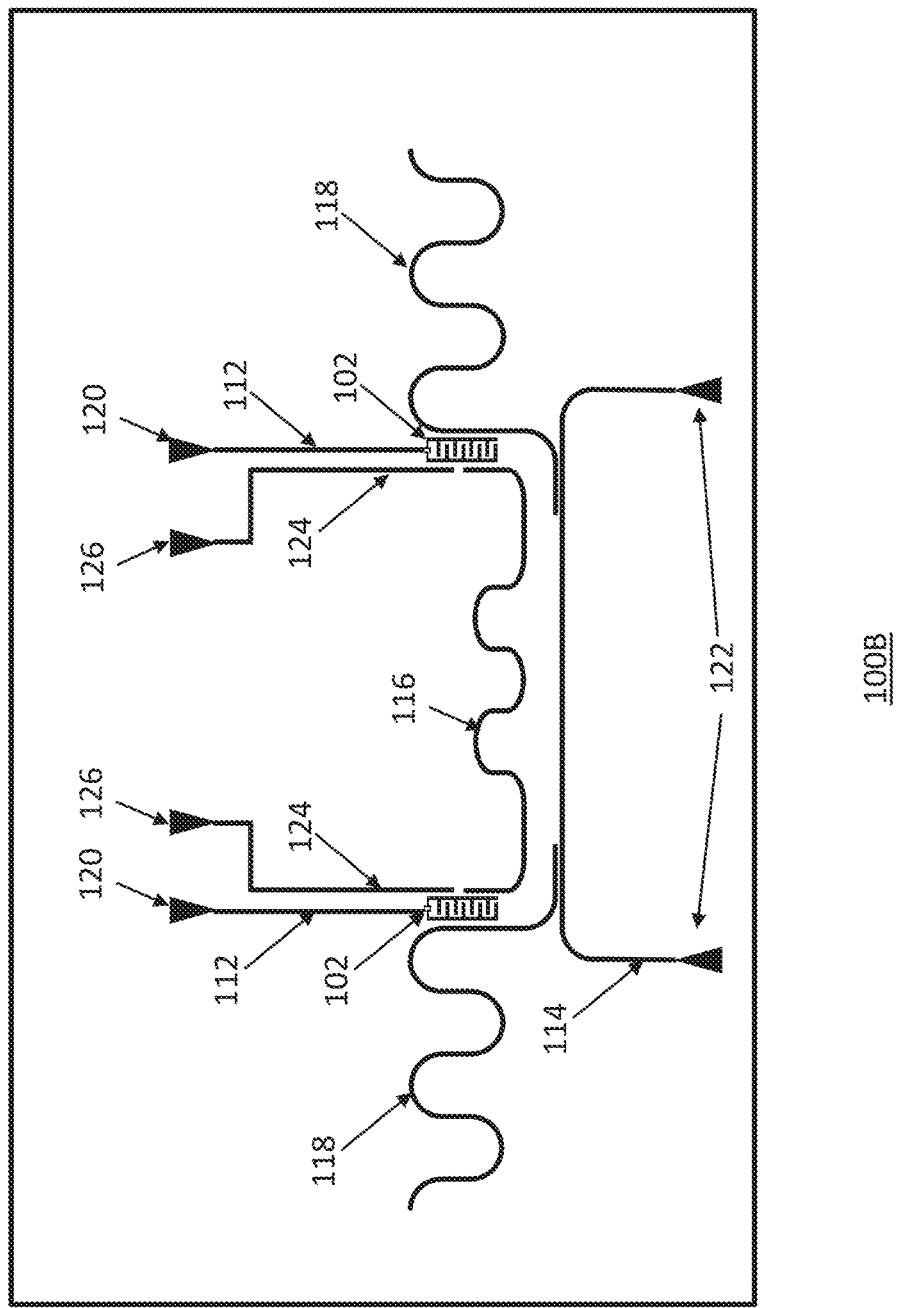
FIG. 1B provides a schematic illustration of an exemplary physical layout of a superconducting quantum circuit, according to some embodiments of the present disclosure.

As previously described herein, within superconducting qubit implementations, three classes are typically distinguished: charge qubits, flux qubits, and phase qubits. Transmons, a type of charge qubits with the name being an abbreviation of "transmission line shunted plasma oscillation qubits", are particularly encouraging because they exhibit reduced sensitivity to charge noise. FIG. 1B provides a schematic illustration of an exemplary physical layout of a superconducting quantum circuit 100B where qubits are implemented as transmons, according to some embodiments of the present disclosure.

Similar to FIG. 1A, FIG. 1B illustrates two qubits 102. In addition, FIG. 1B illustrates flux bias lines 112, microwave lines 114, a coupling resonator 116, a readout resonator 118, and wirebonding pads 120 and 122. The flux bias lines 112 and the microwave lines may be viewed as examples of the external control means 108 shown in FIG. 1A. The coupling resonator 116 and the readout resonator 118 may be viewed as examples of the internal control means 110 shown in FIG. 1A.

Running a current through the flux bias lines 112, provided from the wirebonding pads 120, allows tuning (i.e. changing) the frequency of the corresponding qubits 102 to which each line 112 is connected. It should be noted that the particular geometry of the flux bias lines 112 in the vicinity of the qubits 102 is not specifically illustrated in the schematic illustration of FIG. 1B, but will be explained later with reference to FIGS. 3A through 5F. In general, flux control operates in the following manner. As a result of running the current in a particular flux bias line 112, magnetic field is created around the line. If such a magnetic field is in sufficient proximity to the qubit 102, e.g. by a portion of the flux bias line 112 being provided next to the qubit 102, the magnetic field couples to the qubit, thereby changing the spacing between the energy levels of the qubit. This, in turn, changes the frequency of the qubit since the frequency is directly related to the spacing between the energy levels via Planck's equation. The Planck's equation is $E=hv$, where E is the energy (in this case the energy difference between energy levels of a qubit), h is the Planck's constant and v is the frequency (in this case the frequency of the qubit). As this equation illustrates, if E changes, then v changes. Provided there is sufficient multiplexing, different currents can be sent down each of the flux lines allowing for independent tuning of frequencies of the various qubits.

Typically, the qubit frequency may be controlled in order to bring the frequency either closer to or further away from another resonant item, for example a coupling resonator such as 116 shown in FIG. 1B that connects two or more qubits together, as may be desired in a particular setting.

For example, if it is desirable that a first qubit 102 (e.g. the qubit 102 shown on the left side of FIG. 1B) and a second qubit 102 (e.g. the qubit 102 shown on the right side of FIG. 1B) interact, via the coupling resonator 116 connecting these qubits, then both qubits 102 may need to be tuned to be at nearly the same frequency. One way in which such two qubits could interact is that, if the frequency of the first qubit 102 is tuned very close to the resonant frequency of the coupling resonator 116, the first qubit can, when in the excited state, relax back down to the ground state by emitting a photon (similar to how an excited atom would relax) that would resonate within the coupling resonator 116. If the second qubit 102 is also at this energy (i.e. if the frequency of the second qubit is also tuned very close to the resonant frequency of the coupling resonator 116), then it can absorb the photon emitted from the first qubit, via the coupling resonator 116, and be excited from it's ground state to an excited state. Thus, the two qubits interact in that a state of one qubit is controlled by the state of another qubit. In other scenarios, two qubits could interact via a coupling resonator at specific frequencies, but these three elements do not have to be tuned to be at nearly the same frequency with one another. In general, two or more qubits could be configured to interact with one another by tuning their frequencies to specific values or ranges.

On the other hand, it may sometimes be desirable that two qubits coupled by a coupling resonator do not interact, i.e. the qubits are independent. In this case, by applying magnetic flux to one qubit it is possible to cause the frequency of the qubit to change enough so that the photon it could emit no longer has the right frequency to resonate on the coupling resonator. If there is nowhere for such a frequency-detuned photon to go, the qubit will be better isolated from its surroundings and will live longer in its current state. Thus, in general, two or more qubits could be configured to avoid or eliminate interactions with one another by tuning their frequencies to specific values or ranges.

The state(s) of each qubit 102 may be read by way of its corresponding readout resonator 118. As explained below, the qubit 102 induces a shift in the resonant frequency in the readout resonator 118. This resonant frequency is then passed to the microwave lines 114 and communicated to the pads 122.

To that end, a readout resonator 118 may be provided for each qubit. The readout resonator 118 may be a transmission line that includes a capacitive connection to ground on one side and is either shorted to the ground on the other side (for a quarter wavelength resonator) or has a capacitive connection to ground (for a half wavelength resonator), which results in oscillations within the transmission line (resonance), with the resonant frequency of the oscillations being close to the frequency of the qubit. The readout resonator 118 is coupled to the qubit by being in sufficient proximity to the qubit 102, more specifically in sufficient proximity to the capacitor of the qubit 102, when the qubit is implemented as a transmon, either through capacitive or inductive coupling. Due to a coupling between the readout resonator 118 and the qubit 102, changes in the state of the qubit 102 result in changes of the resonant frequency of the readout resonator 118. In turn, because the readout resonator 118 is in sufficient proximity to the microwave line 114, changes in the resonant frequency of the readout resonator 118 induce changes in the current in the microwave line 114, and that current can be read externally via the wirebonding pads 122.

The coupling resonator 116, also known as a bus resonator, allows coupling different qubits together in order to realize quantum logic gates. The coupling resonator 116 is similar to the readout resonator 118 in that it is a transmission line that includes capacitive connections to ground on both sides (i.e. a half wavelength resonator), which also results in oscillations within the coupling resonator 116. Each side of the coupling resonator 116 is coupled (again, either capacitively or inductively) to a respective qubit by being in sufficient proximity to the qubit, namely in sufficient proximity to the capacitor of the qubit, when the qubit is implemented as a transmon. Because each side of the coupling resonator 116 has coupling with a respective different qubit, the two qubits are coupled together through the coupling resonator 116. In this manner, state of one qubit depends on the state of the other qubit, and the other way around. Thus, coupling resonators may be employed in order to use a state of one qubit to control a state of another qubit.

In some implementations, the microwave line 114 may be used to not only readout the state of the qubits as described above, but also to control the state of the qubits. When a single microwave line is used for this purpose, the line operates in a half-duplex mode where, at some times, it is configured to readout the state of the qubits, and, at other times, it is configured to control the state of the qubits. In other implementations, microwave lines such as the line 114 shown in FIG. 1B may be used to only readout the state of the qubits as described above, while separate drive lines such as e.g. drive lines 124 shown in FIG. 1B, may be used to control the state of the qubits. In such implementations, the microwave lines used for readout may be referred to as readout lines (e.g. readout line 114), while microwave lines used for controlling the state of the qubits may be referred to as drive lines (e.g. drive lines 124). The drive lines 124 may control the state of their respective qubits 102 by providing, using e.g. wirebonding pads 126 as shown in FIG. 1B, a microwave pulse at the qubit frequency, in the form of an electric field, which in turn stimulates (i.e. triggers) a transition between the 0 and 1 state of the qubit.

By varying the length of this pulse, a partial transition can be stimulated, giving a superposition of the 0 and 1 states of the qubit.

As the foregoing description illustrates, while both flux bias lines 112 and drive lines 124 may be used for controlling a qubit, their forms of qubit control are fundamentally different in that a flux bias line applies magnetic field to a SQUID region of a qubit to control the frequency of the qubit, while a drive line applies a pulse to the qubit in the form of an electric field that causes a rotation of the qubit about the Bloch sphere to represent a desired superposition of a qubit.

Flux bias lines, microwave lines, coupling resonators, drive lines, and readout resonators, such as e.g. those described above, together may form interconnects for supporting propagation of microwave signals. Further, any other connections for providing direct electrical interconnection between different quantum circuit elements and components, such as e.g. connections from electrodes of Josephson Junctions to plates of the capacitors or to superconducting loops of superconducting quantum interference devices (SQUIDS) or connections between two ground lines of a particular transmission line for equalizing electrostatic potential on the two ground lines, are also referred to herein as interconnects. Still further, the term "interconnect" may also be used to refer to elements providing electrical interconnections between quantum circuit elements and components and non-quantum circuit elements, which may also be provided in a quantum circuit, as well as to electrical interconnections between various non-quantum circuit elements provided in a quantum circuit. Examples of non-quantum circuit elements which may be provided in a quantum circuit may include various analog and/or digital systems, e.g. analog to digital converters, mixers, multiplexers, amplifiers, etc.

In various embodiments, the interconnects as shown in FIG. 1B could have different shapes and layouts. For example, some interconnects may comprise more curves and turns while other interconnects may comprise less curves and turns, and some interconnects may comprise substantially straight lines. In some embodiments, various interconnects may intersect one another, in such a manner that they don't make an electrical connection, which can be done by using e.g. a bridge, bridging one interconnect over the other. As long as these interconnects operate in accordance with use of these interconnects as known in the art for which some exemplary principles were described above, quantum circuits with different shapes and layouts of the interconnects than those illustrated in FIG. 1B are all within the scope of the present disclosure.

Coupling resonators and readout resonators may be configured for capacitive coupling to other circuit elements at one or both ends in order to have resonant oscillations, whereas flux bias lines and microwave lines may be similar to conventional microwave transmission lines because there is no resonance in these lines. Each one of these interconnects may be implemented as a coplanar waveguide, which is one type of transmission line. A stripline is another type of transmission line. Typical materials to make the interconnects include aluminum (Al), niobium (Nb), niobium nitride (NbN), titanium nitride (TiN), and niobium titanium nitride (NbTiN), all of which are particular types of superconductors. However, in various embodiments, other suitable superconductors may be used as well.

As previously described herein, FIG. 1B illustrates an embodiment specific to transmons. Subject matter is not limited in this regard and may include other embodiments of quantum circuits implementing other types of superconducting qubits that would also utilize Josephson Junctions as described herein, all of which are within the scope of the present disclosure.

Figure 1C:
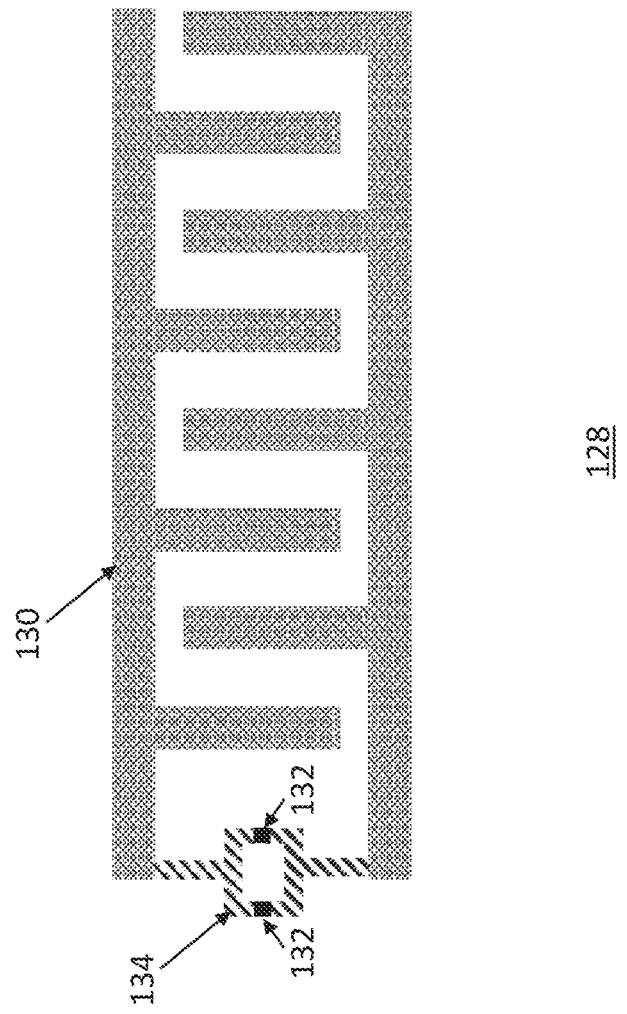
FIG. 1C provides a schematic illustration of an exemplary transmon, according to some embodiments of the present disclosure.

FIG. 1C illustrates an exemplary transmon 128 which could be used as any one of the qubits 102, according to some embodiments of the present disclosure. Presence of a capacitor 130 of such a size that capacitive energy is significantly larger than the Josephson energy in a qubit of FIG. 1C indicates that the qubit is a transmon. The capacitor 130 is configured to store energy in an electrical field as charges between the plates of the capacitor.

The capacitor 130 is depicted as an interdigitated capacitor, a particular shape of capacitor that provides a large capacitance with a small area, however, in various embodiments, other shapes and types of capacitors may be used as well. For example, such a capacitor could be implemented simply as two parallel plates with vacuum in between. Furthermore, in various embodiments, the capacitor 130 may be arranged in any direction with respect to the SQUID or a single Josephson Junction, not necessarily as shown in FIG. 1C.

In addition, the transmon illustrated in FIG. 1C includes two Josephson Junctions 132 incorporated into a superconducting loop 134. The two Josephson Junctions 132 and the superconducting loop 134 together form a superconducting quantum interference device (SQUID). Magnetic fields generated by the flux bias line 112 connected to the qubit extend to the SQUID (i.e. current in the flux bias line 112 create magnetic fields around the SQUID), which in turn tunes the frequency of the qubit.

In other embodiments, a SQUID could include only one Josephson Junction, or a transmon could be implemented with a single Josephson Junction without the superconducting loop. A single Josephson Junction without the SQUID is insensitive to magnetic fields, and thus, in such an implementation, flux bias lines 112 may not be used to control the frequency of the transmon.

While FIGS. 1A and 1B illustrate examples of quantum circuits comprising only two qubits 102, embodiments with any larger number of qubits are possible and are within the scope of the present disclosure. Flux control of at least one of the one or more qubits 102 shown in FIGS. 1A-1C may be carried out by means of flux bias lines below the qubit plane as described herein.

Furthermore, while the present disclosure includes references to microwave signals, this is done only because current qubits are designed to work with such signals because the energy in the microwave range is higher than thermal excitations at the temperature that qubits are operated at. In addition, techniques for the control and measurement of microwaves are well known. For these reasons, typical frequencies of superconducting qubits are in 5-10 gigahertz (GHz) range, in order to be higher than thermal excitations, but low enough for ease of microwave engineering. However, advantageously, because excitation energy of superconducting qubits is controlled by the circuit elements, these qubits can be designed to have any frequency. Therefore, in general, qubits could be designed to operate with signals in other ranges of electromagnetic spectrum and embodiments of the present disclosure could be modified accordingly. All of these alternative implementations are within the scope of the present disclosure.

In various embodiments, quantum circuits such as the one shown in FIGS. 1A-1B may be used to implement components associated with a quantum integrated circuit (IC). Such components may include those that are mounted on or embedded in a quantum IC, or those connected to a quantum IC. The quantum IC may be either analog or digital and may be used in a number of applications within or associated with quantum systems, such as e.g. quantum processors, quantum amplifiers, quantum sensors, etc., depending on the components associated with the integrated circuit. The integrated circuit may be employed as part of a chipset for executing one or more related functions in a quantum system.

Figure 2:
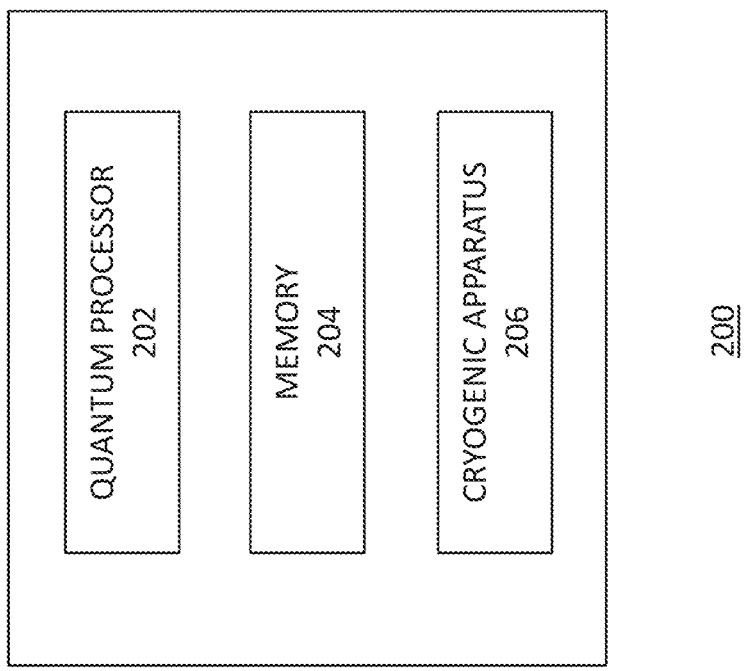
FIG. 2 provides a schematic illustration of a quantum computing device, according to some embodiments of the present disclosure.

FIG. 2 provides an illustration of quantum computing device, e.g. a quantum computer, 200, according to some embodiments of the present disclosure. The computing device 200 may be any electronic device that processes quantum information. In some embodiments, the computing device 200 may include a number of components, including, but not limited to, a quantum processor 202, a memory 204, and a cryogenic apparatus 206, as shown in FIG. 2. Each of the quantum processor 202 and the memory 204 may include one or more quantum circuits comprising structures implementing qubits, e.g. qubits as described with reference to FIGS. 1A-1C, where flux control of at least one of the qubits of may be carried out by means of flux bias lines below the qubit plane as described herein.

The processor 202 may be a universal quantum processor or a specialized quantum processor configured to run quantum simulations, or one or more of particular quantum algorithms. The term "processor" may refer to any device or portion of a device that processes electronic data from registers and/or memory to transform that electronic data into other electronic data that may be stored in registers and/or memory. In some embodiments, the processor 202 may be configured to execute algorithms that may be particularly suitable for quantum computers, such as e.g. cryptographic algorithms that utilize prime factorization, algorithms to optimize chemical reactions, or protein folding algorithms. The term "processor" may refer to any device or portion of a device that processes quantum information.

In various embodiments, the computing device 200 may include other components not shown in FIG. 2, such as e.g. one or more of a controller, I/O channels/devices, supplementary microwave control electronics, multiplexer, signal mixers, a user interface, as well as other quantum devices such as e.g. quantum amplifiers, quantum sensors, which quantum devices may also implement certain embodiments of the present disclosure related to flux control by means of flux bias lines below the qubit plane.

In various embodiments, the computing device 200 may be included within a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 200 may be any other quantum electronic device that processes data by utilizing quantum mechanical phenomena.

In order to highlight the advantages offered by novel flux bias lines proposed herein, it would be helpful to first explain the geometry of conventional flux bias lines.

Figure 3B:
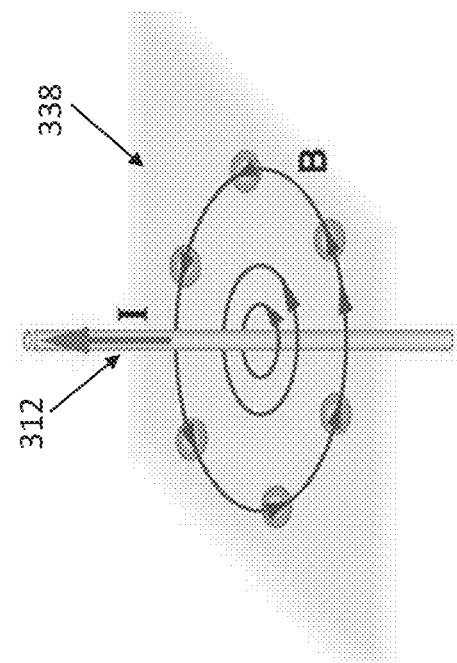
FIG. 3B provides a schematic illustration of a magnetic field generated by a straight current-carrying wire.
Figure 3A:
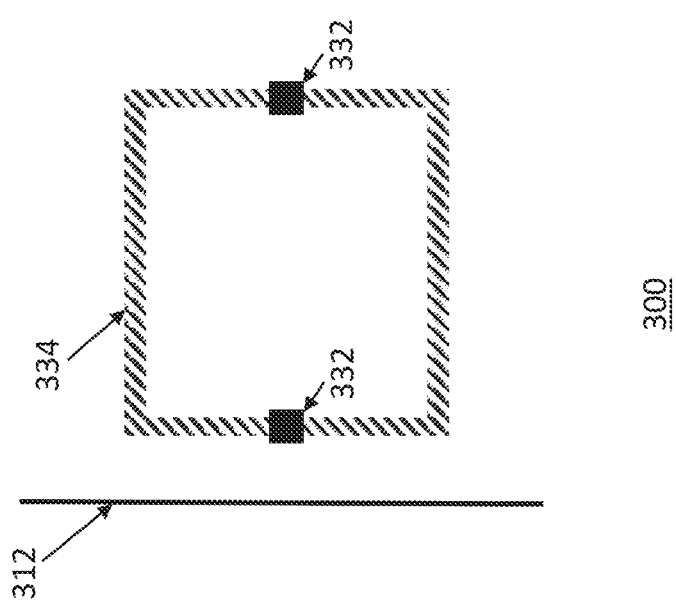
FIG. 3A provides a schematic illustration of a conventional structure where flux control of a qubit is implemented by providing a flux bias line as a straight wire in the qubit plane.

FIG. 3A provides a schematic illustration of a conventional structure 300 where flux control of a qubit is implemented by providing a flux bias line 312 as a straight line in the plane of the qubit. Only the SQUID loop portion of a qubit is shown in FIG. 3A. In particular, FIG. 3A illustrates that a qubit may include a superconducting loop 334 incorporating two Josephson Junctions 332, similar to the transmon qubit 128 shown in FIG. 1C comprising the superconducting loop 134 and two Josephson Junctions 132.

Similar reference numerals in FIGS. 1A-1C, FIGS. 3A-3B, FIGS. 4A-4B, and FIGS. 5A-5F are used to illustrate analogous elements in the figures. For example, reference numerals 112, 312, 412, and 512 shown, respectively, in FIGS. 1A-1C, FIGS. 3A-3B, FIGS. 4A-4B, and FIGS. 5A-5F refer to a flux bias line, reference numerals 132, 332, 432, and 532—to Josephson Junctions, reference numerals 134, 334, 434, and 534—to a superconducting loop of a SQUID, and so on. When provided with reference to one of the figures, discussions of these elements are applicable to other figures, unless stated otherwise. Thus, in the interests of brevity, discussions of similar elements are not repeated for each of the figures but, rather, the differences between the figures are described.

As previously described herein, flux bias lines are used to implement flux control of qubits, i.e. to apply magnetic fields to the qubits that tune frequencies of the qubits to the desired values. As also previously described, controlling the frequency of a qubit may be done to either promote or suppress/prevent interaction of different qubits. Some times it may be desirable for a qubit to have a frequency that is very different from the resonant frequency of a coupling resonator so that the qubit can keep its state for a long time (i.e. not interact with other qubits via the coupling resonator). Other times it is desirable to deliberately cause interaction of two qubits by sharing a photon on the coupling resonator connecting the qubits.

As shown in FIG. 3A, conventional flux control is performed by means of a flux bias line 312 implemented as a substantially straight wire line residing in the qubit plane next to the SQUID region of a transmon, the SQUID region shown in FIG. 3A as comprising the superconducting loop 334 and two Josephson Junctions 332. Passing the current through the straight wire that is the flux bias line 312 generates a radially extending magnetic field that circles around the current carrying wire. FIG. 3B provides a schematic illustration of a magnetic field generated by a straight current-carrying wire. FIG. 3B illustrates current I flowing through the flux bias line 312 in the direction as shown in FIG. 3B with an arrow within the line 312. FIG. 3B further illustrates direction of the magnetic field B radially extending from the line 312 in the planes which are perpendicular to the line 312, shown in FIG. 3B with an exemplary plane 338 (direction of the magnetic field B shown with arrows in the plane 338). If the flux bias line 312 is provided in the plane of the drawing, then the plane 338 is perpendicular to that plane and perpendicular to the line 312. Part of the magnetic field B passes through the SQUID loop as e.g. shown in FIG. 3A and changes the qubit frequency.

FIG. 4A provides a top-view schematic illustration of a structure 400 where flux control of a qubit is implemented by providing a flux bias line 412 below the qubit plane, according to some embodiments of the present disclosure. Similar to FIG. 3A, in order to not clutter the drawing, FIG. 4A only illustrates the SQUID loop portion of a qubit. In particular, similar to FIG. 3A, FIG. 4A illustrates that a qubit may include a superconducting loop 434 incorporating two Josephson Junctions 432, similar to the transmon qubit 128 shown in FIG. 1C comprising the superconducting loop 134 and two Josephson Junctions 132. However, unlike the flux bias line 312 of FIG. 3A which was provided in the qubit plane (i.e. in the plane of the SQUID region shown in FIG. 3A), the flux bias line 412 of FIG. 4A is provided below the qubit plane, as indicated in FIG. 4A with the flux bias line 412 shown with a dashed line. Providing the flux bias line below the qubit plane allows changing the geometry of the line to increase the amount of magnetic field passing through the SQUID region of the qubit for a given amount of current passing through the flux bias line. In particular, implementing the flux bias line 412 as comprising a loop portion (i.e. not a completely closed loop) as e.g. shown with a loop portion 440 in FIG. 4A, results in a magnetic field that comes out substantially vertically to the plane of the flux bias line within the loop portion. This is illustrated in FIG. 4B providing a schematic illustration of a magnetic field generated by a looped current-carrying wire that could be used to implement a flux bias line below the qubit plane such as e.g. the line 412, according to some embodiments of the present disclosure.

Flux control using a flux bias line below the qubit plane, such as e.g. the flux bias line 412, operates in the manner analogous to that described above with reference to the flux bias lines 112 shown in FIG. 1B. Therefore, in the interests of brevity, the general description of flux control using a flux bias line provided above with reference to the flux bias lines 112 is not repeated here.

FIG. 4B illustrates current I flowing through the flux bias line 412 in the direction as shown in FIG. 4B with an arrow within the line 412. Plane 442 shown in FIG. 4B indicates the plane in which the flux bias line 412 may be provided. If the qubit with the SQUID as shown in FIG. 4A is provided in the plane of the drawing of FIG. 4A, then plane 442 is below the plane of the qubit and may be e.g. substantially parallel to the plane of the qubit (i.e. plane 442 is a plane below the plane of the drawing of FIG. 4A and may be parallel to the plane of the drawing of FIG. 4A; as drawn, the plane 442 is perpendicular to the plane of the page containing FIGS. 4A and 4B). FIG. 4B further illustrates directions of the magnetic field B coming out from within the loop portion 440 of the flux bias line 412. Magnetic field portion generated in an area enclosed by the loop portion 440 is configured to control the frequency of the qubit. In other words, a portion of the magnetic field B generated in an area enclosed by the loop portion of the flux bias line such as e.g. the line 412 is used to control the frequency of the qubit.

As can be seen in FIG. 4B with a line 444, magnetic field in the center of the loop portion 440 may be perpendicular with respect to the plane 442. The further the magnetic field B is away from the center of the loop portion 440, the greater is deviation in the direction of the magnetic field from the perpendicular direction 444 (i.e. the more curved the magnetic field is), as is indicated in FIG. 4B with lines 446, 448, and 450. Each of the indicated lines 446, 448, and 450 is gradually more curved (i.e. at a greater angle) from the perpendicular direction 444. In some embodiments, the loop portion 440 may be arranged in such a manner that the average magnetic field portion within the loop portion (i.e. the average of all directions of the magnetic field within the loop portion 440) is substantially perpendicular to the surface of the interconnect layer (i.e. substantially perpendicular to the qubit plane and the plane 442). In this context, the expression "substantially perpendicular" may refer to the average magnetic field direction within the SQUID loop of the qubit which is 10 degrees or less with respect to a direction that is perpendicular to the surface of the interconnect layer (e.g. as shown with the direction 444). Such a geometry of the loop portion 440 would allow sufficiently concentrating the magnetic field that passes the SQUID region so that magnetic field passing the superconducting loop 434 is increased compared to the configuration shown in FIGS. 3A-3B. In other words, due to the geometrical change in the flux bias line that is made possible by providing the flux bias line below the qubit plane, the total amount of current needed to generate a comparable (e.g. the same or similar) magnetic field through the SQUID loop comprising two or more Josephson Junctions is smaller than the total amount of current needed with the flux bias line is provided in the qubit plane as shown in FIGS. 3A-3B. When controlling multiple qubits, smaller flux bias current will advantageously lead to less temperature increases or crosstalk between qubits via the ground plane. Since providing flux bias lines below the qubit plane allows reducing the current necessary to apply the same magnetic field to the SQUID loop, it enables keeping the temperature of the qubit chip down, thus preserving quantum coherence of the qubit(s), and enables more qubits to be controlled within a limited cooling power of a given cooling unit.

Figure 5D:
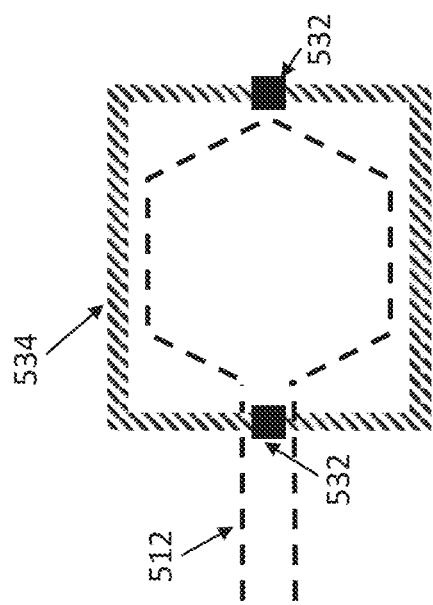
Figure 5F:
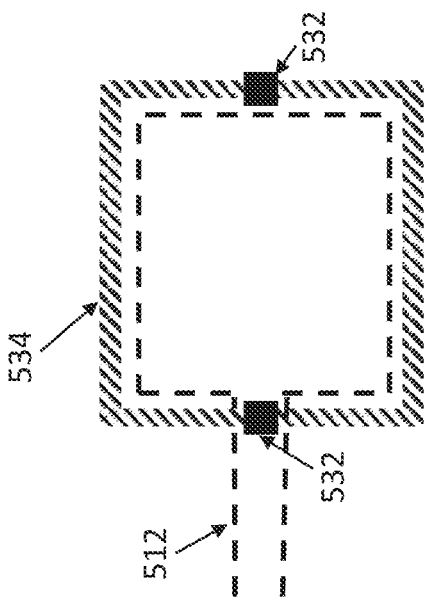
Figure 5E:
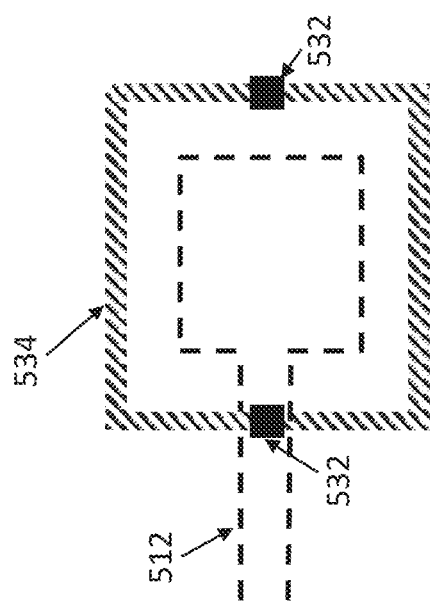

In various embodiments, geometries of the flux bias lines below the qubit plane may be different from that illustrated in FIG. 4A. A specific geometry for a flux bias line may be selected based on considerations such as e.g. the size and the location of the SQUID loop, the amount of magnetic field to be generated in the vicinity of the SQUID loop, and ease of fabrication. FIGS. 5A-5F provide schematic illustrations of various geometries of looped flux bias lines provided below the qubit plane, according to various embodiments of the present disclosure. In some embodiments, the loop portion of a below plane flux bias line 512 may be provided so that, if projected onto a single plane parallel to the surface of the interconnect layer, the loop portion of the flux bias line 512 is enclosed by the SQUID loop 534, as shown in FIG. 5A. In other embodiments, the loop portion of a flux bias line may be provided so that, if projected onto a single plane parallel to the surface of the interconnect layer, the loop portion encloses the SQUID loop 534, as shown in FIG. 5B. In general, a length of the loop portion of the flux bias line 412/512 may be between 0.2 and 5 times a length of the SQUID loop 434/534. In yet other embodiments, not shown in the figures, the loop portion of a below plane flux bias line may at least partially overlap with the SQUID loop, again— if projected onto the same plane. FIGS. 5C and 5D illustrate that the loop portion may take on different geometries such as e.g. a free-style curved loop portion as shown in FIG. 5C, or a polygon loop portion as shown in FIG. 5D. Loop portions of different geometries may be provided as to be enclosed by or enclose the SQUID loop as shown in FIGS. 5A and 5B, respectively, or may at least partially overlap with the SQUID loop. Furthermore, in various embodiments, the loop portion may take on different sizes and be either further away from the SQUID loop as shown in FIG. 5E, or be closer to the SQUID loop as shown in FIG. 5F.

In various embodiments, flux bias lines provided below the qubit plane may take on any combination of geometries illustrated in two or more of FIGS. 4A, and 5A-5F.

In some embodiments, the shape of the loop portion of a below plane flux bias line may conform (i.e. follow, within a predefined deviation) to the shape of the SQUID loop.

In still further embodiments, flux bias lines below the qubit plane do not have to have any loop portions and may be provided as e.g. straight wires below the qubit plane or provided in any non-looped geometry.

In addition, according to various embodiments of the present disclosure, at least some portions of the flux bias lines below the qubit plane described herein may be provided in a plane that is not parallel to the qubit plane.

All of the different geometries and positions of flux bias lines provided below the qubit plane are within the scope of the present disclosure.

While illustrations of FIGS. 4A-4B and FIGS. 5A-5C illustrate portions of the SQUID loops of qubits comprising two Josephson Junctions incorporated into a superconducting loop, teachings provided herein are equally applicable to qubits implementing more than two Josephson Junctions in a SQUID loop, and to any Josephson Junctions implemented as to be sensitive to magnetic fields so that flux bias lines as described herein may be used to control the frequency of the qubit.

Figure 6:
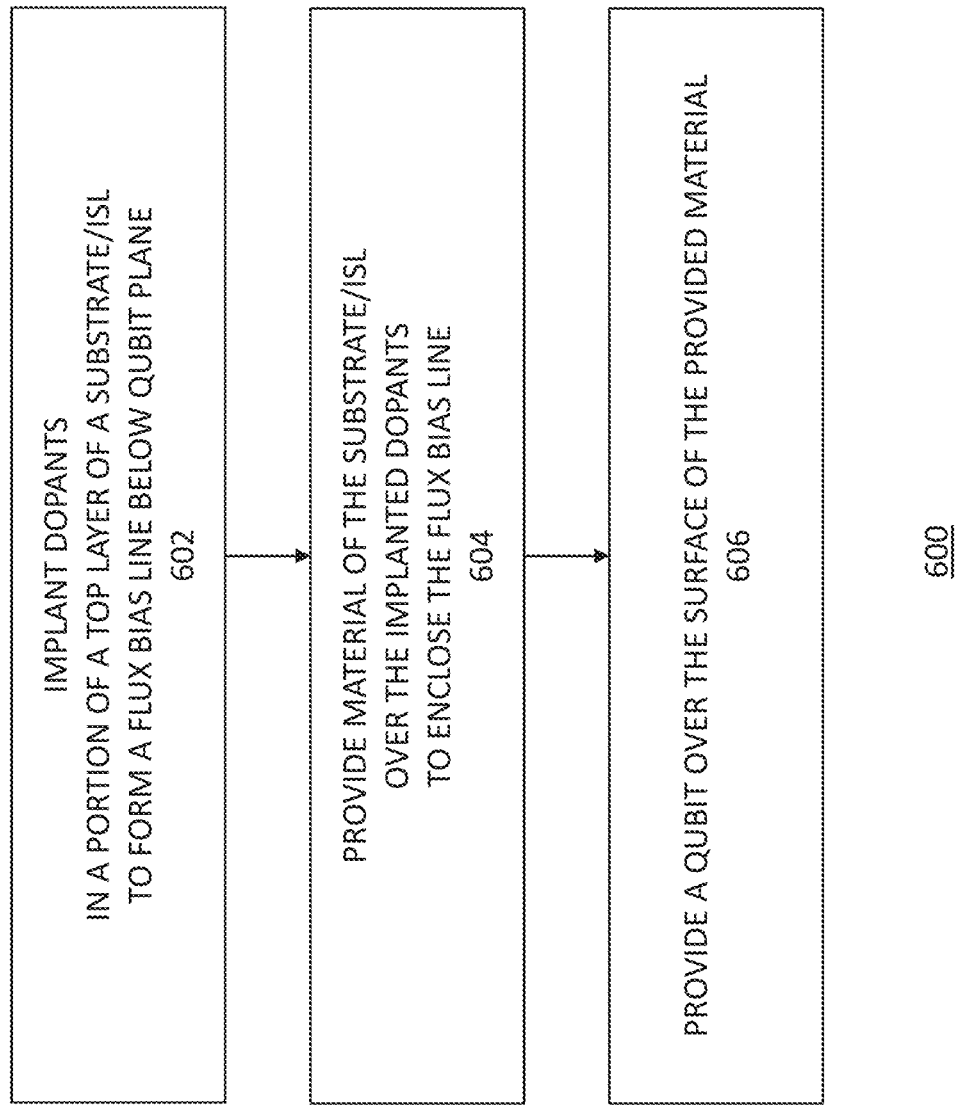
FIG. 6 provides a flow chart of one method for fabricating structures comprising one or more flux bias lines below the qubit plane of a quantum circuit, according to some embodiments of the present disclosure.

FIG. 6 provides a flow chart of one method (method 600) for fabricating structures comprising one or more flux bias lines below the qubit plane of a quantum circuit, according to some embodiments of the present disclosure. Method 600 may be used to form any of the flux bias lines below the qubit plane described herein.

Description of the method 600 is followed by description of FIGS. 7A-7F providing a schematic illustration of some details of different fabrication steps of the method 600, according to some embodiments of the present disclosure.

The method 600 may begin with implanting dopants in a portion of a top layer of a substrate or an interconnect support layer where a flux bias line below the qubit plane it to be formed (box 602). The interconnect support layer may be a substrate or may be provided on top of a substrate and may include any material suitable for realizing quantum circuit components as those described herein, e.g. components as described with reference to FIGS. 1A-1C and FIG. 2.

Once dopants are implanted and activated, the method proceeds with providing material of the substrate/ISL, e.g. using epitaxial (i.e. atomic level) growth techniques, over the portion where the dopants were implanted, thereby enclosing the implanted dopants on the top side (box 604). Providing such a material effectively moves the upper surface of the substrate/ISL up, so that the flux bias line is embedded below the new surface of the substrate/ISL.

Next, one or more qubits are provided on the surface of the material provided in box 604 (step 606). The qubits may be provided at predefined locations above the embedded flux bias line, as e.g. described above with reference to FIGS. 5A-5F, to ensure application of appropriate magnetic fields when current is run through the flux bias line. Since the flux bias line is provided in a plane that is below that of the superconducting qubits, this interconnect is a below-qubit-plane interconnect.

In some embodiments, the distance between the flux bias line and the new surface of the substrate/ILD may be between 50 nanometers (nm) and 50 micrometers (micron), e.g. between 50 nm and 10 microns, between 50 nm and 5 micron, or in any other values and ranges. Providing a flux bias line at such distance from the qubit plane allows ensuring that magnetic fields reaching the SQUID region of the qubit are sufficient and relatively uniform to cause suitable frequency tuning of the qubit. The less is the depth at which the flux bias line is provided in the substrate/ISL, the stronger and the more uniform the magnetic fields reaching different Josephson Junctions of the qubit may be.

As briefly described above, one major source of loss, and thus decoherence in superconducting qubits are spurious TLS's in quantum circuits. In particular, in context of superconducting qubits, the dominant source of decoherence is thought to be TLS's in non-crystalline dielectric materials surrounding interconnects and Josephson Junctions. These TLS's are thought to be either an electron on an ion that can tunnel between two spatial states, which are caused either by defects in the crystal structure of the substrate or through polar impurities such as hydroxyl (OH—) groups, free radicals, or mobile charges.

One mechanism of how spurious TLS's can lead to decoherence of superconducting qubits in a quantum circuit is based on the idea that, if the TLS's are in a close proximity to the interconnect, they can couple to it. When this happens, spurious TLS's and the interconnects exchange energy in the form of energy leaked from the interconnects and absorbed by the spurious TLS's.

When interconnects are embedded in substrates/ISLs, as is the case with the below-plane flux bias lines described herein, more TLS-prone dielectric material of the substrate/ISL surrounds the flux bias lines, compared to flux bias lines and other interconnects provided in or above the qubit plane. Therefore, care should be taken in implementing embedded flux bias lines in order to reduce/minimize the amount of TLS's in the areas surrounding the below-plane flux bias lines. Providing flux bias lines below the qubit plane by dopant implantation in a material of the substrate/ISL allows atomic growth of such a material on top of the below-plane flux bias line. By selecting the dielectric material of the substrate/ISL as a material that can be relatively low-loss in terms of losses to spurious TLS's described above, as e.g. crystalline dielectric materials are thought to be, losses to spurious TLS's in the areas surrounding the below-plane flux bias lines may be minimized. Looking at it from a slightly different perspective, the flux bias lines may not be perfect in that they may have some spurious TLS's, but by keeping at least some of them away from the qubit plane (by implementing them as below-plane flux bias lines), and by surrounding the qubit plane with crystalline material in its near vicinity, any TLS's induced by the conventional patterning of the flux bias lines below the qubit plane would be sufficiently far away from the qubit plane to act as a loss. In other words, providing at least some flux bias lines below the qubit plane may have the further advantage of allowing to tolerate that such flux bias lines could have some defects because those defects do not matter if the flux bias lines are sufficiently far enough away from the qubit plane.

In various embodiments, steps of the method shown in FIG. 6 may be realized in different manners. Some of those are shown in FIGS. 7A-7F. Each of these figures illustrates a cross-sectional view of a structure comprising a flux bias line embedded in a substrate/ISL, with the cross-section taken along a plane perpendicular to the substrate/ISL. A legend provided within a dashed box at the bottom of each page containing these figures illustrates patterns used to indicate different elements shown in FIGS. 7A-7F so that these figures are not cluttered by many reference numerals.

FIGS. 7A-7F are now described with reference to the substrate/ISL being a silicon substrate. However, teachings provided herein allow adapting these discussions to other types of substrates/ISLs, all of which are within the scope of the present disclosure.

FIGS. 7A-7D illustrate implementation of box 602 of the method shown in FIG. 6, according to some embodiments of the present disclosure. FIG. 7A illustrates that fabrication process of box 602 of FIG. 6 may begin with a clean substrate 702, e.g. a silicon (Si) substrate. Any standard processing cleaning techniques as known in the art may be applied to obtain single crystal silicon surface that is either as received from a supplier or has an intrinsic (i.e. non-doped or low-doped, where doping is either unintentional or deliberate) epitaxially grown silicon region in the upper 0.5 to 5 microns. In various implementations, this thin epitaxially grown region may comprise silicon that is sufficiently pure so that it can behave as a low-loss insulator at qubits operating temperatures (i.e. either no dopants or sufficiently low-level of dopants) or might be isotopically enriched 28Si (i.e. sufficiently few atoms with nuclear moments to ensure a low loss).

In this context, non-doped or low-doped silicon implies a non-conductive silicon at temperatures at which qubits operate (i.e. very low temperatures). Intrinsic layers may sometimes be accidentally doped with defects due to e.g. the addition of unintentional impurities (e.g., O, residual dopants in the chamber, etc) or unintentional doping from the highly conductive region by diffusion during subsequent thermal processing. Furthermore, sometimes dopants may be deliberately added to materials for reasons such as e.g. thermal or mechanical stability. As long as dopants, whether unintentional or deliberately added, are in amounts that are low enough so that the substrate may still be considered low-loss and insulating at low temperatures at which qubits operate, such silicon may be referred to as intrinsic or non-doped silicon.

After that, photoresist may be deposited over the substrate 702, and then patterned so that there are openings in the photoresist in regions where the flux bias line(s) will be. FIG. 7B illustrates photoresist 704 patterned to form an opening 706 over a portion of the upper surface of the substrate 702. Dimensions of the opening 706 in the x- and y-directions (x, y, and z-axes shown at the bottom of FIGS. 7A-7D) could be, respectively, between 50 nm (nanometers) and 100 um (microns) for both the x-axis and y-axis, including all values and ranges therein. In various embodiments, any kind of photoresist patterning techniques as known in the art may be used for creating the photoresist layer 704 as shown in FIG. 7B.

Next, dopants 708 are implanted into the Si substrate 702 through the photoresist mask 704. As shown in FIG. 7C, this results in dopants implanting in area 710 of the Si substrate exposed by the window 706. Dopants are also implanted into the photoresist, as shown with an area 712 of photoresist of FIG. 7C illustrating dopants, but dopants implanted into photoresist do not reach the Si substrate below it.

Dopant implantation may be performed by any known dopant implantation techniques. For example, the Si or SiGe substrate 702 may be doped with phosphorus (P) or arsenic (As) to doping concentrations ranging 1e18 to 1e21, including all values and ranges therein, e.g. to about 1e20. As a result, doped regions such as the region 710 could be made superconductive, as suitable for superconducting interconnects, e.g. flux bias lines, employed in quantum circuits.

After that, the photoresist may be cleaned off, as shown in FIG. 7D, and the substrate may be annealed to activate the dopants. In some implementations, the photoresist mask may be removed e.g. via a process such as ashing, where the photoresist is exposed to oxygen or fluorine, which combines with the photoresist to form ash which can subsequently be removed. Annealing to activate dopants may, for example, be performed at temperatures in the range of 900° C. to 1100° C., including all values and ranges therein, for a time period in the range of 1 nanoseconds to 1 minute, including all values and ranges therein.

The substrate 702 with a portion 710 comprising implanted and activated dopants may then, optionally, be cleaned again, using any suitable cleaning techniques as known in the art.

Next, Si may be grown over the substrate 702 with the doped portion 710 using any of the atomic level growth techniques as known in the art, e.g. using epitaxial growth. Si grown over the substrate with the doped portion 710 is shown in FIG. 7E, illustrating the result of fabrication of box 604 of the method shown in FIG. 6. As shown in FIG. 7E, growth of Si over the substrate 702 with the doped portion 710 results in the doped portion being embedded (enclosed on at least top and bottom) within the substrate, i.e. being below the new surface of the substrate, shown in FIG. 7E as a surface 714, but above the very bottom of the substrate.

At this point, a qubit 716 may be provided over the new surface 714 (box 606 of the method shown in FIG. 6), as shown in FIG. 7F with portions 718 and 720 of such a qubit. For example, portions 718 and 720 may represent the Josephson Junctions of the SQUID region of the qubit 716, e.g. the Josephson Junctions 432 shown in FIG. 4A. When a current pulse or DC current is provided in the flux bias line formed by the dopants 708, magnetic field B in the directions schematically shown with thick black arrows 722 and 724 is generated. If the flux bias line comprises a loop portion as defined by a dashed box 726 in FIG. 7F, then the generated magnetic field may be substantially perpendicular to the qubit plane in the center of the loop portion, as shown in FIG. 7F with the magnetic field in the direction 722. The magnetic field may deviate from the substantially vertical direction further away from the center of the loop portion, as shown in FIG. 7F with the magnetic fields in the directions 724, as was also illustrated in FIG. 4B.

Figure 8:
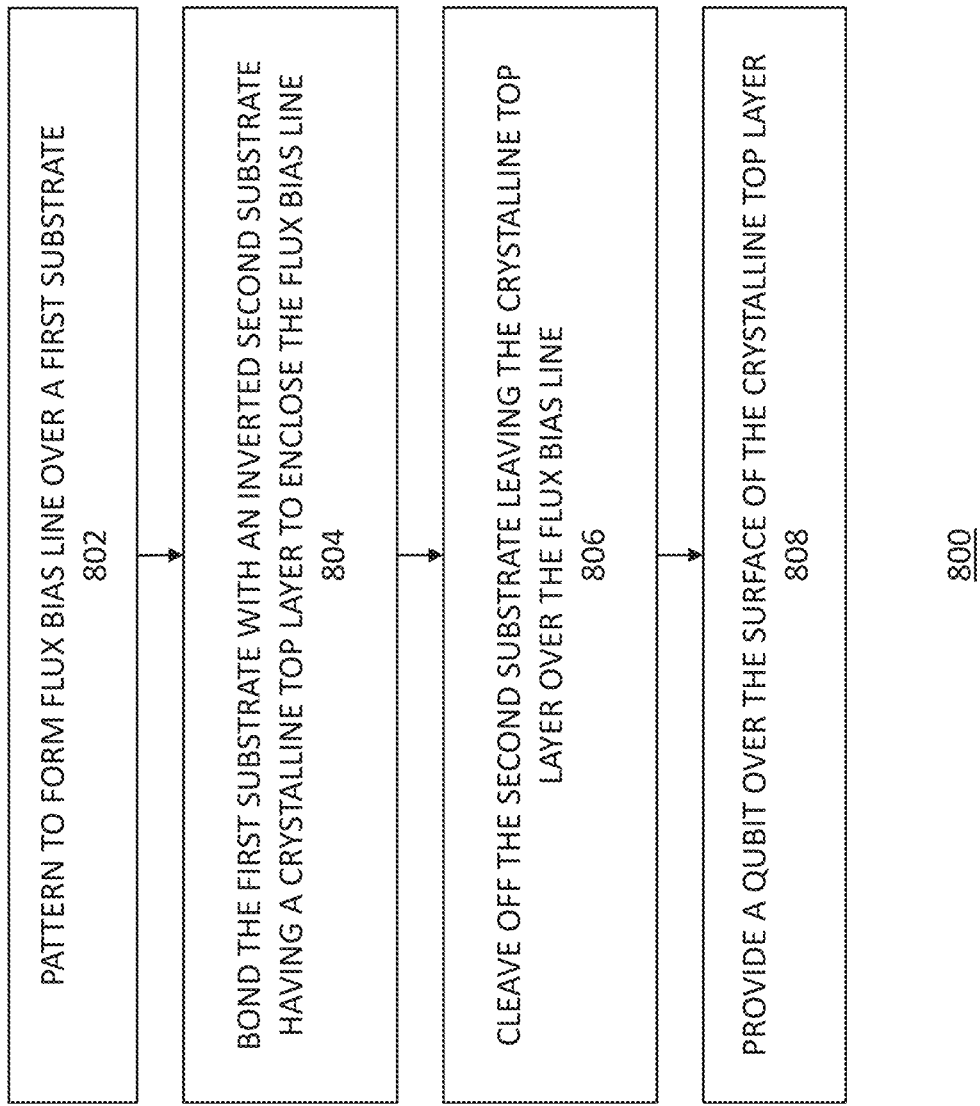
FIG. 8 provides a flow chart of another method for fabricating structures comprising one or more flux bias lines below the qubit plane of a quantum circuit, according to some embodiments of the present disclosure.

FIG. 8 provides a flow chart of another method (method 800) for fabricating structures comprising one or more flux bias lines below the qubit plane of a quantum circuit, according to some embodiments of the present disclosure. Method 800 may be used to form any of the flux bias lines below the qubit plane described herein.

Description of the method 800 is followed by description of FIGS. 9A-9E, providing a schematic illustration of some details of different fabrication steps of the method 800, according to some embodiments of the present disclosure.

The method 800 may begin with performing conventional patterning to form, over a first substrate/ISL, a desired interconnect that will later function as a flux bias line below the qubit plane (box 802). The patterning is conventional in a sense that it forms an interconnect on top of a substrate/ISL, as known in the art for materials with superconducting behavior at qubit operating temperatures. At this point this flux bias line is not yet below the surface on which qubits will be provided.

The conventional patterning of box 802 may use the typical materials such as e.g. superconductors, barriers, liners, dielectrics, hard masks, and so on, to form a patterned flux bias line over a first substrate. The flux bias line may be covered with a thin layer of materials that would promote bonding of the first substrate with a second substrate, e.g. a thin layer of silicon oxide. Such a layer used for bonding could be e.g. between 10 and 500 nm, including all values and ranges therein, e.g. between 10 and 100 nm or around 100 nm.

The method then proceeds with bonding the first substrate having the flux bias line provided thereon with a second substrate (box 804). In some embodiments, the second substrate could be a Silicon-on-Insulator (SOI) wafer, i.e. a wafer having a thin layer of crystalline silicon on top of an insulator provided over the rest of the silicon substrate. The SOI wafer will typically also have an oxide on top to bond with the silicon oxide on the lower wafer containing the flux bias line. The wafer may be treated with plasma sputter ash to remove surface contaminants prior to bonding. The SOI wafer is inverted, pushed together with the wafer on which the flux bias line was patterned, and thermally treated for chemical bonding via the two silicon oxide layers. Such thermal treatment may include e.g. a relatively low temperature bonding, e.g. applying temperature in the range of 100 to 500 degrees Celsius. As a result, the flux bias line formed on the first substrate in box 802 is now enclosed by crystalline material both on its top and bottom sides. In case the flux bias line of box 802 was formed by recessing the surface of a crystalline first substrate, such interconnect would be enclosed by crystalline material also on at least some of its sides.

In other embodiments, the second substrate could be a wafer that has a crystalline Al2O3 (sapphire) grown on it epitaxially. The sapphire could be an alternative to the crystalline silicon on top of an insulator in a SOI wafer, i.e. it would serve as a crystalline material enclosing the flux bias line in the first substrate.

Following bonding of the first and second substrates, most of the second substrate is cleaved off, leaving the crystalline top layer over the flux bias line (box 806). Doing so effectively moves the upper surface of the first substrate higher, so that now the flux bias line is embedded relatively near to the new surface of the first substrate.

Next, one or more qubits are provided on the surface of the crystalline top layer that formed the new surface of the first substrate in box 806 (step 808). Descriptions with respect to box 606 and with respect to the distances between the flux bias line and the new surface of the first substrate provided above are applicable to the method 800 and, in the interest brevity, are not repeated.

Similar to the description provided with reference to the method 600, one major source of loss, and thus decoherence in superconducting qubits are spurious TLS's in quantum circuits. Providing the flux bias lines below the qubit plane by bonding of two substrates allows enclosing a conventionally formed flux bias line by other materials, i.e. providing a below-plane interconnect. By selecting the dielectric materials of the two substrates to be materials that can be relatively low-loss in terms of losses to spurious TLS's or other resistive elements described above, as e.g. crystalline dielectric materials are thought to be, losses to spurious TLS's in the areas surrounding the below-plane flux bias lines may be minimized.

In various embodiments, steps of the method shown in FIG. 8 may be realized in different manners. Some of those are shown in FIGS. 9A-9E. Each of these figures illustrates a cross-sectional view of a structure comprising a flux bias line embedded in a substrate, with the cross-section taken along a plane perpendicular to the substrate. A legend provided within a dashed box at the bottom of each page containing these figures illustrates patterns used to indicate different elements shown in FIGS. 9A-9E so that these figures are not cluttered by many reference numerals.

FIGS. 9A-9E are now described with reference to the substrate/ISL being a silicon substrate. However, teachings provided herein allow adapting these discussions to other types of substrates/ISLs, all of which are within the scope of the present disclosure.

FIGS. 9A-9D illustrate implementation of boxes 802-806 of the method shown in FIG. 8, according to some embodiments of the present disclosure. A fabrication process of box 802 of FIG. 8 may begin with a substrate 902, e.g. a silicon (Si) substrate.

In some embodiments, the substrate 802 may comprise at least a layer of non-doped or low-doped silicon. Discussions provided above with respect to non-doped, low-doped, and intrinsic silicon are applicable here and, in the interests of brevity, are not repeated.

FIG. 9A illustrates that a superconducting flux bias line 906 may be patterned on top of the substrate 902, and is covered with a thin layer 908 of silicon oxide. Dimensions of the flux bias line 906 in the x- and y-directions (x, y, and z-axes shown at the top of FIG. 9A) could be, respectively, between 50 nm (nanometers) and 100 um (microns) for both the x-axis and y-axis, including all values and ranges therein.

In some embodiments, the flux bias line 906 may be formed by adding it on top of the first substrate 902, in which case another dielectric may be provided as a material on the sides 904 of the flux bias line 906, as shown in FIG. 9A. Any material suitable for use as an interlayer dielectric (ILD) may be used for this purpose. Alternatively, the flux bias line 906 may be formed by recessing the top of the first substrate 902 to form an opening into which superconducting material of the flux bias line 906 is then deposited. This implementation may be advantageous because it eliminates the need for including another dielectric material around the flux bias line, which dielectric material could be more lossy than the substrate 902, i.e. areas 904 shown in FIG. 9A could then be made from the same material as the substrate 902. Areas 904 and 902 in the figures are shown with different patterns only to preserve the generality that these areas could be made of different materials.

In various embodiments, any kind of conventional patterning techniques may be used to form the flux bias line 906 on the first substrate 902. For example, first a photoresist mask defining the dimensions and location of the future flux bias line 906 may be formed. Exemplary photoresist patterning details provided above are applicable here and, in the interests of brevity, are not repeated.

Following patterning of the portion 906 for forming the flux bias line below the qubit plane, the substrate with the flux bias line 906 may be covered with a thin layer 908 of silicon oxide used for bonding. This may be done e.g. by chemical vapor deposition, plasma-enhanced chemical vapor deposition, and/or spin coating as typically done in conventional processing.

Next, in box 804 of FIG. 8 described above, the first substrate 902 having the portion 906 provided therein is bonded with an inverted second substrate. This is illustrates in FIG. 9B showing the second substrate as a SOI wafer comprising a silicon substrate 914, a thin silicon oxide layer 912 for attaching a thin SOI layer 910 to the silicon substrate 914, and the SOI layer 910. In various embodiments, the thickness of the SOI layer 910 is between 10 and 150 nm, including all values and ranges therein, e.g. around 100 nm. The second substrate is inverted, as is shown in FIG. 9B with the first and second substrates 902 and 914 being, respectively, the bottom and the top layers of the stack. The SOI wafer may, and typically would include, another thin layer of silicon oxide used for substrate bonding, similar to the layer 908 provided over the first substrate as shown in FIG. 9A. However, for reasons of clarity, FIG. 9B and subsequent figures illustrate only a single silicon oxide layer 908 because that would be the case after bonding.

It should also be noted that, since the SOI wafer is not patterned when it is bonded to the first substrate, there is no specific critical registration or alignment that may be needed between the two wafers, simplifying the fabrication/bonding process.

The SOI substrate is then cleaved off, as described with reference to box 806 of FIG. 8 and as shown in FIG. 9C, resulting in a thin crystalline layer 910 being transferred on top of the flux bias line 906.

Next, the oxide 912 is removed from the surface of the SOI layer 910, as shown in FIG. 9D, and the surface may further be cleaned using an appropriate cleaning technique. Removing the oxide and cleaning the surface 916 of the SOI layer 910 may be done prior to provision of the one or more qubits in box 808 of FIG. 8 in order to improve quality of Si/superconductor interface in terms of removal of any lossy native oxide layers. This may further be followed by any deposition or treatment to change the chemical nature of the resulting Si surface. Such processing may include removal of the oxide 912 by using one or a combination of wet chemical fluorine etching solutions including but not limited to aqueous HF or aqueous $NH_4F$ or combinations thereof. Such processing may also include dry etching, for example using a plasma dry etch tool along with $SF_6$, $CF_4$, or $NF_3$, or any combination thereof to remove native oxide followed by further in-situ or ex-situ processing which may include, but is not limited to, high temperature thermal treatments for times up to a few hours at temperatures up to 1400 C, exposure of the surface to hot gaseous vapor or plasmas containing chemicals such as $N_2$, $NH_3$, organic molecules, organosilicon molecules, metal precursors, etc, designed to create a chemically distinct transition region between the Si substrate and the superconducting film to be deposited in later steps.

As shown in FIG. 9D, bonding of the first and second substrates and removing everything of the second substrate except the SOI layer 910 results in the flux bias line 906 being embedded (enclosed on at least top and bottom) within the structure, i.e. being below the surface of the structure but above the very bottom of the substrate. In particular, the flux bias line 906 is enclosed on the bottom by the crystalline first substrate 902 and on top by the crystalline SOI layer 910, both of which are expected to have reduced amounts of spurious TLS's detrimental to qubits' operation. The top surface 915 of the crystalline SOI layer 910 may now be considered to be the top surface of the first substrate 902.

Figure 9E:
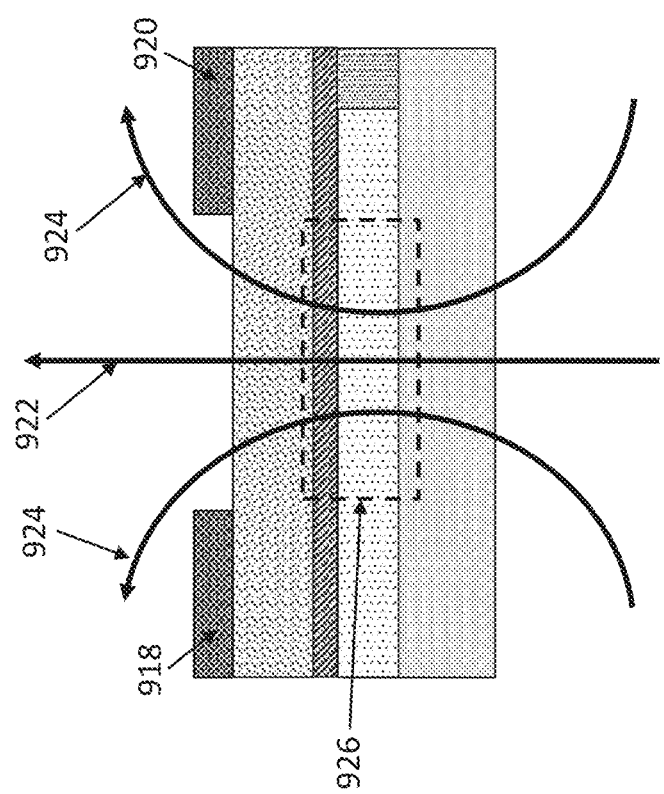
Figure 9E:
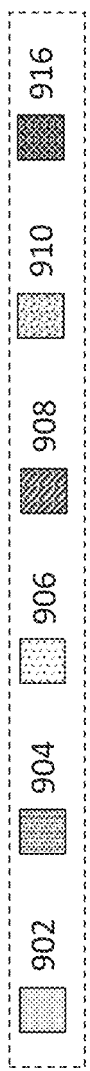

At this point, a qubit 916 may be provided over the new surface 915 (box 808 of the method shown in FIG. 8), as shown in FIG. 9E with portions 918 and 920 of such a qubit. For example, portions 918 and 920 may represent the Josephson Junctions of the SQUID region of the qubit 916, e.g. the Josephson Junctions 432 shown in FIG. 4A. When a current pulse or DC current is provided in the flux bias line 906, magnetic field B in the directions schematically shown with thick black arrows 922 and 924 is generated. If the flux bias line comprises a loop portion as defined by a dashed box 926 in FIG. 9E, then the generated magnetic field may be substantially perpendicular to the qubit plane in the center of the loop portion, as shown in FIG. 9E with the magnetic field in the direction 922. The magnetic field may deviate from the substantially vertical direction further away from the center of the loop portion, as shown in FIG. 9E with the magnetic fields in the directions 924, as was also illustrated in FIG. 4B.

Figure 10:
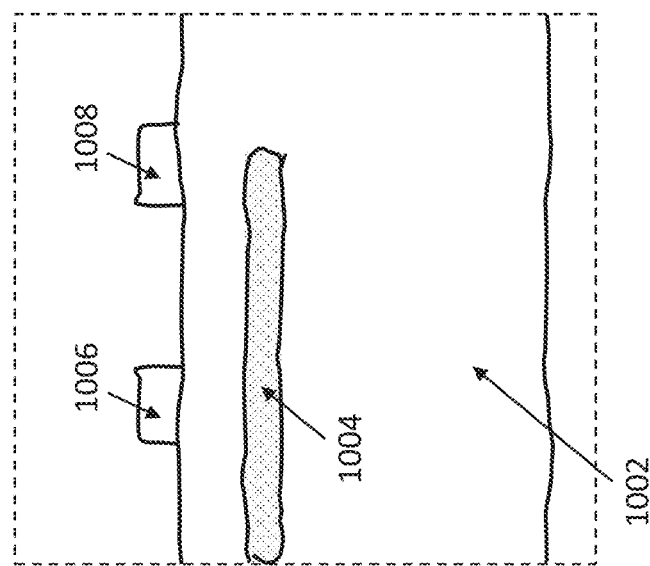
FIG. 10 provides a schematic illustration of a structure comprising a flux bias line below the qubit plane of a quantum circuit, according to some embodiments of the present disclosure.

FIG. 10 provides a schematic illustration of a cross-section 1000 of a structure comprising a flux bias line 1004 below the qubit plane of a quantum circuit, according to some embodiments of the present disclosure. As can be seen, FIG. 10 is drawn to reflect example real world process limitations, in that the features are not drawn with precise right angles and straight lines. As shown, FIG. 10 represents a cross-section view similar to that shown in FIGS. 7F and 9E. FIG. 10 illustrates a substrate/ISL 1002, the flux bias line 1004 embedded therein e.g. by dopant implantation or by substrate bonding, and parts 1006 and 1008 of a qubit provided above the flux bias line 1004, as could be visible in e.g. a scanning electron microscopy (SEM) image or a transmission electron microscope (TEM) image of a structure comprising the below-plane flux bias line 1004. In such an image of a real structure, possible processing defects could also be visible, such as e.g. tapered vias, occasional screw, edge, or combination dislocations within the crystalline Si region, occasional dislocation defects of single atoms or clusters of atoms.

Some Examples in accordance with various embodiments of the present disclosure are now described.

Example 1 provides a quantum integrated circuit package for controlling a frequency of a qubit, the quantum integrated circuit package including a substrate; a qubit disposed over a surface of the substrate; and a flux bias line below the surface of the substrate. The flux bias line may be configured to control the frequency of the qubit via a magnetic field generated as a result of a current flowing through the flux bias line.

Example 2 provides the quantum integrated circuit package according to Example 1, where the qubit includes a closed loop of a superconducting quantum interference device (SQUID loop), and the flux bias line includes a loop portion (i.e. not a completely closed loop) provided in a predefined location relative to a location of the SQUID loop, e.g. below the SQUID loop.

Example 3 provides the quantum integrated circuit package according to Example 2, where a length of the loop portion is between 0.2 and 5 times a length of the SQUID loop.

Example 4 provides the quantum integrated circuit package according to Examples 2 or 3, where a projection of the SQUID loop on a plane, e.g. a plane substantially parallel to the surface of the interconnect layer, encloses a projection of the loop portion on the plane.

Example 5 provides the quantum integrated circuit package according to Examples 2 or 3, where a projection of the loop portion on a plane, e.g. a plane substantially parallel to the surface of the interconnect layer, encloses a projection of the SQUID loop on the plane.

Example 6 provides the quantum integrated circuit package according to any one of Examples 2-5, where a shape of the loop portion conforms to a shape of the SQUID loop.

Example 7 provides the quantum integrated circuit package according to any one of the preceding Examples, where the flux bias line is provided at a distance between 50 nanometers (nm) and 100 micrometers (micron) below the surface of the substrate.

Example 8 provides the quantum integrated circuit package according to any one of the preceding Examples, where at least a portion of a material of the substrate provided below the flux bias line is silicon.

Example 9 provides the quantum integrated circuit package according to any one of the preceding Examples, where at least a portion of the material of the substrate provided between the between the flux bias line and the surface of the substrate includes a dielectric material with losses in a microwave spectrum being below a predefined threshold.

Example 10 provides the quantum integrated circuit package according to any one of the preceding Examples, where the at least a portion of the material of the substrate provided between the flux bias line and the surface of the substrate includes epitaxial silicon.

Example 11 provides the quantum integrated circuit package according to any one of the preceding Examples, where the flux bias line includes a material of the substrate doped to be electrically conductive.

Example 12 provides the quantum integrated circuit package according to any one of the preceding Examples, where the flux bias line includes a material of the substrate doped to be superconductive.

Example 13 provides the quantum integrated circuit package according to of Examples 1-9, where at least a portion of the material of the substrate provided below the lower interconnect includes alumina or GaAs.

Example 14 provides the quantum integrated circuit package according to any one of Examples 2-13, where the SQUID loop and the flux bias line include one or more of superconductive materials.

Example 15 provides the quantum integrated circuit package according to Example 14, where the one or more of superconductive materials includes one or more of aluminium (Al), niobium (Nb), niobium nitride (NbN), titanium nitride (TiN), or niobium titanium nitride (NbTiN).

Example 16 provides the quantum integrated circuit package according to any one of the preceding Examples, where the qubit includes two or more Josephson Junctions.

In another Example of a quantum integrated circuit package according to any one of Examples 2-16, the flux bias line may be configured to generate a magnetic field as a result of a current flowing through the flux bias line (in order to control the frequency of the qubit), which magnetic field may include a magnetic field portion generated in an area enclosed by the loop portion. In other words, a portion of the magnetic field generated in an area enclosed by the loop portion of the flux bias line is used to control the frequency of the qubit. In one further Example, the average magnetic field portion within the SQUID loop of the qubit may be substantially perpendicular to the surface of the interconnect layer (i.e. substantially perpendicular to the qubit plane).

Example 17 provides a method for fabricating a quantum circuit package, the method including implanting dopants in a portion of a top layer of a substrate to form a flux bias line, where the substrate is a silicon layer; activating the implanted dopants; epitaxially growing silicon on the top layer of the substrate; and providing a qubit over or on a surface of the epitaxially grown silicon, above the flux bias line.

Example 18 provides the method according to Example 17, where the top layer of an substrate includes an uppermost layer of intrinsic or low-doped epitaxially grown silicon.

Example 19 provides the method according to Example 18, where the uppermost layer of intrinsic or low-doped epitaxially grown silicon includes silicon that is sufficiently pure to behave as a low-loss insulator at qubit operating temperatures.

Example 20 provides the method according to Example 18, where the uppermost layer of intrinsic or low-doped epitaxially grown silicon includes isotopically enriched silicon.

Example 21 provides the method according to any one of Examples 18-20, where the uppermost layer of intrinsic or low-doped epitaxially grown silicon has a thickness between 0.5 and 5 micrometers.

Example 22 provides a method for fabricating a quantum circuit package, the method including patterning a flux bias line on or over a first substrate; bonding the first substrate with an inverted second substrate, where the second substrate includes a silicon on insulator (SOI) layer; removing a portion of the second substrate until a surface of the SOI layer is exposed; and forming a qubit over or on the SOI layer, above the flux bias line.

Example 23 provides the method according to Example 22, where, prior to the bonding, each of the flux bias line and the SOI layer includes a layer of silicon oxide configured to promote the bonding of the first substrate with the inverted second substrate.

Example 24 provides the method according to Examples 22 or 23, where bonding includes thermal bonding at temperatures between 100 and 500 degrees Celsius.

Example 25 provides the method according to any one of Examples 22-24, where the SOI layer has a thickness between 50 nanometers and 100 micrometers.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

The invention claimed is:

1. A quantum integrated circuit package for controlling a frequency of a qubit, the quantum integrated circuit package comprising:
   a substrate;
   a qubit disposed over a surface of the substrate; and
   a flux bias line below the surface of the substrate.

2. The quantum integrated circuit package according to claim 1, wherein:
   the qubit comprises a loop of a superconducting quantum interference device (SQUID loop), and
   the flux bias line comprises a loop portion below the SQUID loop.

3. The quantum integrated circuit package according to claim 2, wherein a length of the loop portion is between 0.2 and 5 times a length of the SQUID loop.

4. The quantum integrated circuit package according to claim 2, wherein a projection of the SQUID loop on a plane encloses a projection of the loop portion on the plane.

5. The quantum integrated circuit package according to claim 2, wherein a projection of the loop portion on a plane encloses a projection of the SQUID loop on the plane.

6. The quantum integrated circuit package according to claim 2, wherein a shape of the loop portion conforms to a shape of the SQUID loop.

7. The quantum integrated circuit package according to claim 2, wherein the flux bias line is provided at a distance between 50 nanometers and 100 micrometers below the surface of the substrate.

8. The quantum integrated circuit package according to claim 1, wherein at least a portion of a material of the substrate provided below the flux bias line is silicon.

9. The quantum integrated circuit package according to claim 1, wherein at least a portion of the material of the substrate provided between the between the flux bias line and the surface of the substrate comprises a dielectric material with losses in a microwave spectrum being below a predefined threshold.

10. The quantum integrated circuit package according to claim 1, wherein the at least a portion of the material of the substrate provided between the flux bias line and the surface of the substrate comprises epitaxial silicon.

11. The quantum integrated circuit package according to claim 1, wherein the flux bias line comprises a material of the substrate doped to be electrically conductive.

12. The quantum integrated circuit package according to claim 1, wherein the flux bias line comprises a material of the substrate doped to be superconductive.

13. The quantum integrated circuit package according to claim 1, wherein at least a portion of the material of the substrate provided below the lower interconnect comprises alumina or GaAs.

14. The quantum integrated circuit package according to claim 2, wherein the SQUID loop and the flux bias line comprise one or more of superconductive materials.

15. The quantum integrated circuit package according to claim 14, wherein the one or more of superconductive materials comprises one or more of aluminium (Al), niobium (Nb), niobium nitride (NbN), titanium nitride (TiN), or niobium titanium nitride (NbTiN).

16. The quantum integrated circuit package according to claim 1, wherein the qubit comprises two or more Josephson Junctions.

17. A method for fabricating a quantum circuit package, the method comprising:
    implanting dopants in a portion of a top layer of a substrate to form a flux bias line, wherein the substrate is a silicon layer;
    activating the implanted dopants;
    epitaxially growing silicon on the top layer of the substrate; and
    providing a qubit over or on a surface of the epitaxially grown silicon, above the flux bias line.

18. The method according to claim 17, wherein the top layer of an substrate comprises an uppermost layer of intrinsic or low-doped epitaxially grown silicon.

19. The method according to claim 18, wherein the uppermost layer of intrinsic or low-doped epitaxially grown silicon comprises silicon that is sufficiently pure to behave as a low-loss insulator at qubit operating temperatures.

20. The method according to claim 18, wherein the uppermost layer of intrinsic or low-doped epitaxially grown silicon comprises isotopically enriched silicon.

21. The method according to claim 18, wherein the uppermost layer of intrinsic or low-doped epitaxially grown silicon has a thickness between 0.5 and 5 micrometers.

22. A method for fabricating a quantum circuit package, the method comprising:
    patterning a flux bias line on or over a first substrate;
    bonding the first substrate with an inverted second substrate, wherein the second substrate comprises a silicon on insulator (SOI) layer;
    removing a portion of the second substrate until a surface of the SOI layer is exposed; and
    forming a qubit over or on the SOI layer, above the flux bias line.

23. The method according to claim 22, wherein, prior to the bonding, each of the flux bias line and the SOI layer comprises a layer of silicon oxide configured to promote the bonding of the first substrate with the inverted second substrate.

24. The method according to claim 22, wherein bonding comprises thermal bonding at temperatures between 100 and 500 degrees Celsius.

25. The method according to claim 22, wherein the SOI layer has a thickness between 50 nanometers and 100 micrometers.

* * * * *

UNITED STATES PATENT AND TRADEMARK OFFICE
CERTIFICATE OF CORRECTION

| | |
|---|---|
| PATENT NO. | : 11,361,240 B2 |
| APPLICATION NO. | : 16/307970 |
| DATED | : June 14, 2022 |
| INVENTOR(S) | : Jeanette M. Roberts et al. |

It is certified that error appears in the above-identified patent and that said Letters Patent is hereby corrected as shown below:

In the Claims

In Column 26, Line 57, in Claim 9, delete "between the between the" and insert -- between the --, therefor.

Signed and Sealed this
Thirteenth Day of December, 2022

Katherine Kelly Vidal
*Director of the United States Patent and Trademark Office*